(12) United States Patent
Pai et al.

(10) Patent No.: US 11,336,288 B1
(45) Date of Patent: May 17, 2022

(54) CHARGE PUMP WITH VOLTAGE TRACKING

(71) Applicant: Qualcomm Incorporated, San Diego, CA (US)

(72) Inventors: Hung-Chuan Pai, Irvine, CA (US); Marco Zanuso, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/315,337

(22) Filed: May 9, 2021

(51) Int. Cl.
*H03L 7/089* (2006.01)
*H03L 7/093* (2006.01)

(52) U.S. Cl.
CPC ............ *H03L 7/0893* (2013.01); *H03L 7/093* (2013.01); *H03L 2207/06* (2013.01)

(58) Field of Classification Search
CPC ......... H03L 7/085; H03L 7/087; H03L 7/089; H03L 7/0891; H03L 7/0895; H03L 7/0896; H03L 7/0898; H03L 7/093; H03L 2207/06

See application file for complete search history.

(56) References Cited

U.S. PATENT DOCUMENTS 9,455,723 B2 * 9/2016 Vahid Far ............. H03L 7/0802
2012/0256665 A1 * 10/2012 Teng ..................... H03L 7/0816
327/156

OTHER PUBLICATIONS

Charles C.T., et al., "A Buffered Charge Pump with Zero Charge Sharing," IEEE International Symposium on Circuits and Systems, 2008, pp. 2633-2636.
Larsson P., "A 2-1600-MHz CMOS Clock Recovery PLL with Low-Vdd Capability," IEEE Journal of Solid-State Circuits, Dec. 1999, vol. 34, No. 12, pp. 1951-1960.
Razavi B., "PLLs and Synthesizers," Electrical Engineering Department, University of California, Los Angeles, Mar. 4, 2010, 18 pages.
Young I.A., et al., "A PLL Clock Generator with 5 to 110 MHz of Lock Range for Microprocessors," IEEE Journal of Solid-State Circuits, Nov. 1992, vol. 27, No. 11, pp. 1599-1607.

* cited by examiner

*Primary Examiner* — Diana J. Cheng
(74) *Attorney, Agent, or Firm* — Colby Nipper

(57) ABSTRACT

An apparatus is disclosed for a charge pump with voltage tracking. In an example aspect, the apparatus includes a locked loop having a charge pump, a filter, a second switch, and a buffer. The charge pump includes a first current source, a second current source, and a first switch coupled between the first current source and the second current source. The filter is coupled to the charge pump between the first switch and the second current source. The second switch is coupled to the charge pump between the first current source and the first switch. The buffer is coupled between the filter and the second switch, with the buffer comprising a voltage buffer.

30 Claims, 14 Drawing Sheets

CHARGE PUMP WITH VOLTAGE TRACKING

TECHNICAL FIELD

This disclosure relates generally to facilitating wireless communication using an electronic device and, more specifically, to a locked loop and an associated charge pump for use therein.

BACKGROUND

Electronic devices (e.g., smartphones) may provide services relating to communication, finances, social interaction, entertainment, productivity, transportation, and so forth. To provide these services, an electronic device may depend at least partly on electronic communications. Electronic communications can include those exchanged between distributed electronic devices using wireless or wired signals that are transmitted over one or more networks, such as the Internet or a cellular network. Electronic communications can also include those exchanged between or among different printed circuit boards, modules, chips, or even cores or other circuit portions of a given integrated circuit that are located within a housing of a single electronic device. Regardless, an electronic device can participate in electronic communications by generating or propagating electrical or electromagnetic signals.

Such electronic communications are typically made using a signal that is designed to have a specified characteristic. The signals of electronic communications are more likely to be correctly transmitted and received, as well as properly interpreted, if the specified characteristic is accurately and reliably produced. Regarding a frequency characteristic of a signal, a frequency synthesizer can be used to create, or synthesize, a desired frequency. Electronic devices thus employ frequency synthesizers to synthesize signals having desired frequencies. Typically, a frequency synthesizer includes a frequency generator, such as a phase-locked loop (PLL) and/or a delay-locked loop (DLL).

In operation, a PLL receives a reference signal with a reference frequency and applies the reference signal to a feedback loop. Using the feedback loop, the circuitry of the PLL generates an output signal that oscillates at a desired frequency based at least on the reference frequency of the reference signal. Accordingly, the PLL of an electronic device outputs an oscillating signal having some synthesized frequency. The electronic device can use the synthesized frequency of the oscillating signal in one or more stages of a communication scenario. Example stages for communicating a signal include generating, transmitting, receiving, and interpreting a communication signal.

In an example signal-generation stage, a frequency synthesized by the PLL can be used to modulate a communication signal. The modulation may entail encoding or adding information (e.g., a text and an associated photograph) to the communication signal. In an example signal-transmission stage, a frequency synthesized by the PLL can be employed to up-convert a frequency of a modulated communication signal using a mixer that is part of a transmit chain. With an up-conversion operation, the mixer increases a frequency of the communication signal. The increased frequency enables the communication signal to be transmitted wirelessly as a radio-frequency (RF) electromagnetic (EM) signal that propagates in free space (e.g., between a smartphone and a cellular base station).

The PLL can also be used with the stages of a reception side of a typical communication scenario. For example, the PLL can be used to down-convert a frequency of a received communication signal using a mixer that is part of a receive chain. After down-conversion, the PLL can be used to demodulate the down-converted communication signal to interpret the signal and thereby recover the encoded information. Additionally, the PLL can be used to produce a synthesized frequency for a clock signal that controls a rate of operation of clock-synchronized circuitry of an integrated circuit. Examples of such an integrated circuit include a system-on-chip (SoC), a modem baseband that processes a communication signal, and a graphics chip that processes video data that is being displayed to a user.

Thus, a PLL, or another type of locked loop, can operate in any of multiple stages of a communication scenario to support electronic communications with electronic devices. A locked loop can also be employed in synchronously operated circuitry to support coordinated interoperations among different portions of electronic devices. A degree to which a locked loop is stable, power-efficient, and/or accurate to produce a clean synthesized frequency depends partly on the performance of the components that make up the locked loop. Consequently, scientists, engineers, and other designers of electronic devices strive to design and build components that enable a locked loop to operate with stability, power-efficiency, and/or accuracy.

SUMMARY

Locked loops, like a phase-locked loop (PLL), can generate a signal with a reliable frequency. Generally, a locked loop can respond more quickly to maintain a stable frequency as a bandwidth of the locked loop increases. A locked loop can include at least a phase-frequency detector (PFD), a charge pump, and a filter. The charge pump can include two current sources and can be coupled between the PFD and the filter. The charge pump provides a charge signal to the filter responsive to the phase-frequency detector. The flow of charge between the charge pump and the filter can result in a low impedance at the charge pump that decreases the bandwidth of the locked loop. To increase the charge-pump impedance and the locked-loop bandwidth, example implementations include a buffer that is switchably coupled between the filter and the charge pump. In operation, the buffer can track a voltage of the filter and provide a version of the voltage to the charge pump to "stabilize" a voltage experienced by a current source of the charge pump. In some cases, the buffer can operate using current from the charge pump to save power consumption.

In an example aspect, an apparatus including a locked loop is disclosed. The locked loop includes a charge pump, a filter, a second switch, and a buffer. The charge pump includes a first current source, a second current source, and a first switch coupled between the first current source and the second current source. The filter is coupled to the charge pump between the first switch and the second current source. The second switch is coupled to the charge pump between the first current source and the first switch. The buffer is coupled between the filter and the second switch, with the buffer comprising a voltage buffer.

In an example aspect, an apparatus for tracking voltage in conjunction with a charge pump is disclosed. The apparatus includes first current source means for applying a first current with respect to at least one capacitor of a filter. The apparatus also includes second current source means for applying a second current with respect to the at least one capacitor of the filter. The apparatus additionally includes buffer means for tracking a voltage of the filter and coupling a version of the voltage to the first current source means. The apparatus further includes means for switching the first current source means from applying the first current to the at least one capacitor of the filter in a first operational phase to applying the first current to the buffer means in a second operational phase.

In an example aspect, a method for tracking voltage in conjunction with a charge pump is disclosed. The method includes closing a first switch of a charge pump and routing a current between a first current source and at least one capacitor of a filter based on the closing of the first switch. The method also includes opening the first switch of the charge pump and closing a second switch, which is coupled between the charge pump and a buffer, based on the opening of the first switch. The method additionally includes routing the current between the first current source and the buffer based on the closing of the second switch. The method further includes producing a voltage at the second switch based on a voltage of the filter using the buffer.

In an example aspect, an apparatus including a locked loop is disclosed. The locked loop includes a charge pump, a filter coupled to the charge pump, a switch coupled to the charge pump, and a buffer coupled between the filter and the switch. The buffer includes a first transistor having a source terminal, a drain terminal, and a gate terminal, with the drain terminal coupled to the switch, and the gate terminal coupled to the filter. The buffer also includes a second transistor having a source terminal, a drain terminal, and a gate terminal. For the second transistor, the source terminal is coupled to the drain terminal of the first transistor, and the gate terminal is coupled to the source terminal of the first transistor. The buffer additionally includes a third transistor having a source terminal and a drain terminal. For the third transistor, the source terminal is coupled to a ground, and the drain terminal is coupled to the source terminal of the first transistor. The buffer further includes a fourth transistor having a source terminal and a drain terminal. For the fourth transistor, the source terminal is coupled to the ground, and the drain terminal is coupled to the drain terminal of the second transistor.

BRIEF DESCRIPTION OF DRAWINGS

FIG. 4-1 illustrates example aspects of a phase-frequency detector and a charge pump in conjunction with a buffer and a filter.

FIG. 4-2 illustrates alternative example aspects of a phase-frequency detector and a charge pump in conjunction with a buffer and a filter.

FIG. 6-1 illustrates an example circuit diagram of a charge pump coupled to a buffer and a filter, with the buffer coupled between the filter and the charge pump to provide a voltage-tracking function.

FIG. 6-2 illustrates another example circuit diagram of a charge pump coupled to a buffer and a filter, with the buffer coupled between the filter and the charge pump to provide a voltage-tracking function.

FIG. 6-3 illustrates an alternative example circuit diagram of a charge pump coupled to a buffer and a filter, with the buffer coupled between the filter and the charge pump to provide a voltage-tracking function.

FIG. 6-4 illustrates another alternative example circuit diagram of a charge pump coupled to a buffer and a filter, with the buffer coupled between the filter and the charge pump to provide a voltage-tracking function.

FIG. 8-1 illustrates example principles of charge sharing with the second configuration using the diode of FIG. 7.

FIG. 8-2 illustrates example principles of charge sharing with the first configuration using the buffer of FIG. 7.

DETAILED DESCRIPTION

Figure 1:
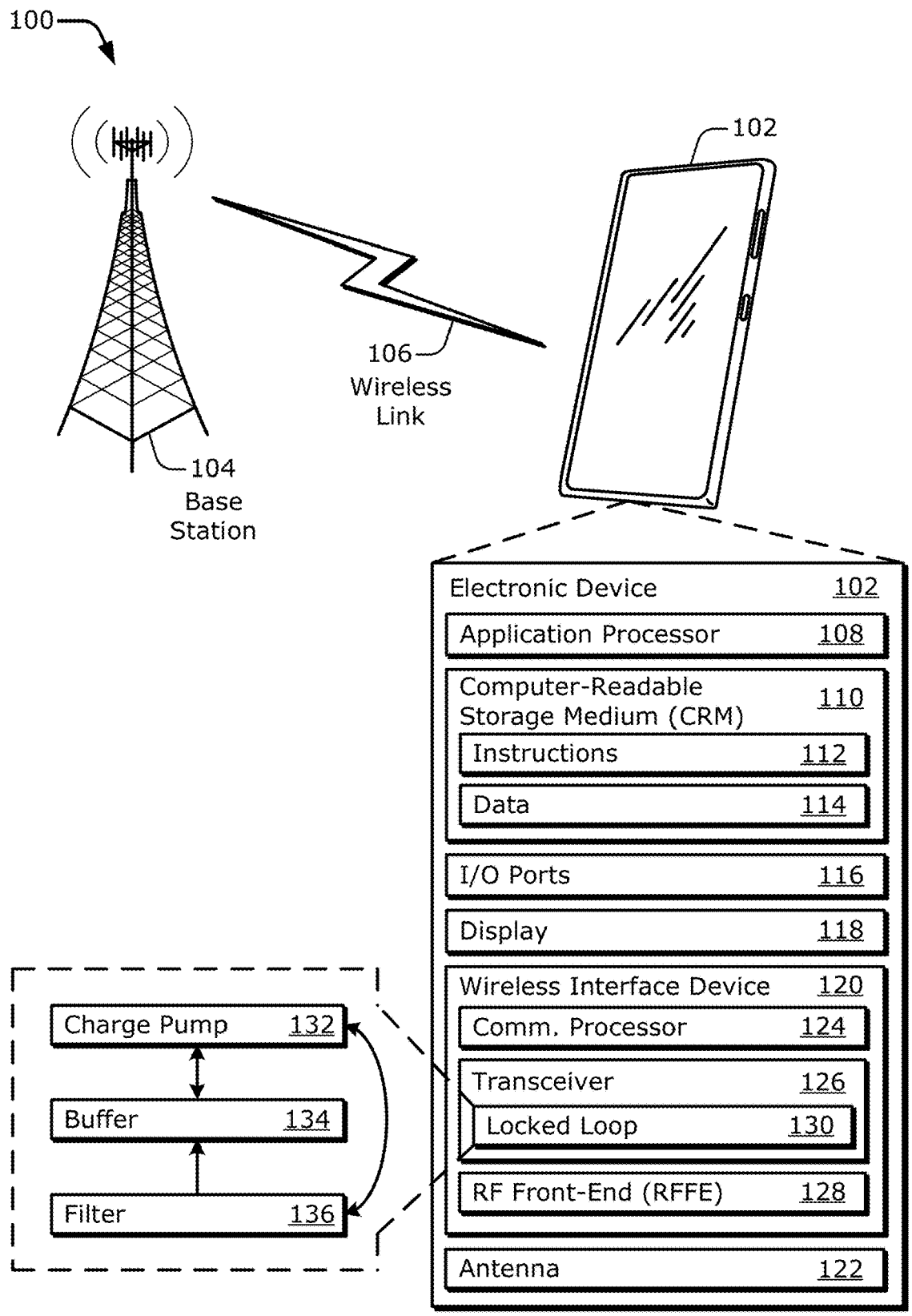
FIG. 1 illustrates an environment with an example electronic device including a wireless interface device, which includes a transceiver having a locked loop that uses a charge pump with a voltage-tracking function.

Electronic communications may use signals that oscillate at different frequencies. Electronic devices use various components to create signals having different signal characteristics, including different oscillation frequencies. For example, electronic devices may use frequency synthesizers to generate signals having targeted oscillation frequencies. To do so, an oscillating signal is input to a feedback loop that produces a signal having a frequency characteristic that is generated to facilitate an electronic communication. In addition to enabling the production and processing of communication signals, frequency synthesizers are used to generate clock signals that control the timing of processing operations in integrated circuits, such as synchronous circuitry. These integrated circuits can include a central processing unit (CPU), a graphics processing unit (GPU), a system-on-chip (SoC), and so forth.

Thus, electronic devices use oscillating signals that rise and fall at some frequency. The frequency may be constant or may be changing responsive to a desired frequency modulation. For example, electronic devices can use oscillating signals to control a rate at which processing operations are performed, for example, with a clock signal. Additionally or alternatively, electronic devices can use oscillating signals to facilitate transmission and reception of signals in different communication scenarios. For instance, oscillating signals can be used with mixers that perform frequency translations for up-conversion or down-conversion. Further, oscillating signals can be used to encode information (e.g., a text and an associated photograph) by applying a frequency-based modulation to a signal.

These oscillating signals can be generated by a frequency synthesizer, which can include circuitry implementing a type of locked loop. The frequency synthesizer produces an output signal having a synthesized frequency that is based at least on a reference frequency of a reference signal and a divider value "D" (e.g., which in some cases is derived from a selectable modulus value "M"). The divider value controls how much the frequency synthesizer changes (e.g., increases or decreases) the reference frequency to produce the synthesized frequency of the output signal. Example types of locked loops are a delay-locked loop (DLL) and a phase-locked loop (PLL). The accuracy and stability of DLL-based and PLL-based frequency synthesizers are partially contingent on the performance of the underlying circuitry. The underlying circuitry may include, for example, a phase-frequency detector, a charge pump, a filter, a feedback path for the locked loop, and/or control circuitry of the locked loop. A PLL type of locked loop may also include a voltage-controlled oscillator (VCO).

These components of a locked loop interact as part of a feedback system to produce a given frequency. Achieving a target performance level for a locked loop can be challenging because the locked loop performance can depend on the performance of each component individually and on the performance of the multiple components acting together in a feedback system. For example, a phenomenon called "charge sharing" can occur between the charge pump and the filter of a locked loop. The charge pump includes at least one current source that can be implemented with a transistor having an intrinsic parasitic capacitance. The filter includes at least one capacitor having a capacitance. During operation, the two capacitances can interact as charge is shared between them. The charge sharing can cause a signal being generated to shift phase in a manner that produces a less pure oscillating output signal for the locked loop.

In some cases, the phase shift issue arising from the charge sharing can be mitigated using a leaking current source and a diode as a "dummy load." The diode can be coupled to a first current source of the charge pump to accept current therefrom if a present operational phase entails avoiding the addition of charge to the capacitor of the filter. This can maintain the current flow of the first current source of the charge pump even while the charge pump is not providing current to the filter. Meanwhile, a second current source of the charge pump can be "leaking constantly" to withdraw a charge from the filter. In some cases, the constantly leaking current source can be a down current source (e.g., FIGS. 4-1, 6-1, 6-2, and 7) that may draw current from the filter. In other cases, the constantly leaking current source can be an up current source (e.g., FIGS. 4-2, 6-3, and 6-4) that may provide current to the filter.

Using the diode, however, results in a relatively lower output impedance by the charge pump as current flows with the parasitic capacitance of the first current source are relatively high. This lower charge-pump output impedance can reduce the bandwidth of the locked loop, which may slow the response time of the loop. In some environments, the locked loop can operate within specifications with the reduced bandwidth. In different environments, on the other hand, the reduced bandwidth may curtail the responsiveness of the locked loop more than is permissible by a targeted performance level.

For example, in power-sensitive applications, such as a mobile or battery-powered device, reducing power usage may be a design goal. A VCO of a PLL can be built in manners to trade noise versus power usage. Thus, to lower the power usage of a VCO, the VCO may produce greater noise. The greater noise can be accommodated, however, by increasing the bandwidth of the locked loop. Accordingly, the relatively lower output impedance of the charge pump that results from employing the diode as a dummy load may become problematic in these environments because this diode approach reduces the loop bandwidth.

A technique that addresses the charge sharing and produces a higher charge pump output impedance to enable an increased locked loop bandwidth can therefore operate in conjunction with a power-saving VCO, even if the VCO produces more noise to use less power. This document describes example implementations that can use a buffer to reduce charge sharing and increase the charge-pump output impedance. The buffer reduces the amount of current flow with respect to an intrinsic capacitance of a current source of the charge pump, thereby increasing the output impedance of the charge pump. With the increased output impedance of the charge pump, the filter can provide a wider bandwidth to respond more quickly to establish or maintain a locked frequency.

In example implementations, a locked loop includes at least a phase-frequency detector (PFD), a charge pump, a filter, and a buffer. The charge pump can include a first current source (e.g., an up current source or a down current source) coupled in series with a second current source (e.g., a down current source or an up current source, respectively) and a first switch. The charge pump receives at least one control signal from the phase-frequency detector to determine a state of the first switch—an open state or a closed state. The charge pump can have an output that is electrically located between the first and second current sources. The output of the charge pump is coupled to an input of the filter. The buffer is coupled between the filter and the charge pump via a second switch, which is coupled between the charge pump and the buffer.

To design and build the charge pump and the buffer, an engineer may use several types of active circuit elements. In an example aspect, a manufacturer may use complementary metal-oxide-semiconductor (CMOS) technology, where active circuit elements can include n-type metal-oxide-semiconductor field-effect transistors (n-MOSFETs), p-type MOSFETs (p-MOSFETs), a combination of n-MOSFETs and p-MOSFETs, and/or other active circuit elements. In another example aspect, the manufacturer may use bipolar junction transistor (BJT) technology and may utilize n-type and p-type doped semiconductors to build negative-positive-negative (NPN) BJTs, positive-negative-positive (PNP) BJTs, a combination of NPN and PNP BJTs, and/or other active elements. If a manufacturer uses CMOS-based technology, the up current source of the charge pump can include at least one p-MOSFET, and the down current source may include at least one n-MOSFET. As described herein, an n-MOSFET may be considered a complementary type of transistor relative to the p-MOSFET. If a manufacturer, however, uses BJT-based technology, the up current source of the charge pump can include at least one PNP BJT, and the down current source may include at least one NPN BJT. In a BJT context, an NPN BJT may be considered a complementary type of transistor relative to the PNP BJT. For brevity and clarity, accompanying figures (e.g., FIGS. 6-1 to 7) of this description illustrate example circuit arrangements using CMOS-based technology (e.g., n-MOSFETs and p-MOSFETs). This description, however, is not limited to CMOS-based technology, for depicted circuits can be implemented with FETs, junction FETs (JFETs), BJTs, and so forth.

Continuing with CMOS-based technology, in an example circuit arrangement, a source terminal of the p-MOSFET of the up current source is coupled to a supply voltage ($V_{DD}$), a drain terminal of the p-MOSFET is coupled to a drain terminal of the n-MOSFET of the down current source, and a source terminal of the n-MOSFET is coupled to ground (GND). The locked loop can use the first switch to enable or disable flow of a current with respect to the first current source relative to the filter. The locked loop can use the second switch to enable or disable flow of the current with respect to the first current source relative to the buffer.

The buffer is coupled to the filter to track a voltage thereof. During operation, the buffer can produce a voltage at the second switch based on a control voltage at the filter. By providing a tracking voltage to the first current source, the currents flowing with respect to the parasitic capacitance can be reduced. The reduced current flow increases the output impedance of the charge pump to increase the loop bandwidth of the locked loop. This supports using a VCO or another loop component that may increase an in-band noise of the locked loop. In some implementations, the buffer includes at least one voltage buffer, such as a first voltage buffer and a second voltage buffer. When using CMOS-based technology, a voltage buffer can include a source-follower amplifier to track the control voltage at the second switch. When using BJT-based technology, a voltage buffer can include an emitter-follower amplifier to track the control voltage at the second switch.

The buffer may also include a current mirror and a bias circuit for biasing the circuitry of the buffer. The current mirror may be distributed across multiple voltage buffers and may use a diode-connected transistor. The buffer may be self-biased, and, to save power, the current corresponding to the first current source (e.g., the up current source 412 in FIG. 4-1 or the down current source 414 in FIG. 4-2) can be used by the buffer to provide the voltage tracking. In such manners, a buffer can use voltage tracking to increase an output impedance of a charge pump of a locked loop, and the higher impedance can increase or widen a bandwidth of the locked loop. These and other example implementations are described herein. First, however, this document describes example environments of an electronic device having a wireless interface device and a wireless interface device having a locked loop (e.g., a PLL) with reference to FIGS. 1 and 2, respectively.

FIG. 1 illustrates an example environment 100 with an electronic device 102 having a wireless interface device 120, which includes a transceiver 126 having a locked loop 130. The locked loop 130 includes a charge pump 132, a buffer 134, and a filter 136 (e.g., a loop filter). The locked loop 130 may be any type of locked loop that can utilize the charge pump 132, the buffer 134, and the filter 136 as described herein. For example, the locked loop 130 may be implemented as a phase-locked loop (PLL) or a delay-locked loop (DLL). The charge pump 132, the buffer 134, and the filter 136 are described further below, starting with FIG. 3.

In the environment 100, the example electronic device 102 communicates with a base station 104 through a wireless link 106. In FIG. 1, the electronic device 102 is depicted as a smartphone. The electronic device 102 may, however, be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable wireless communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6 or WiGig®); an IEEE 802.16 standard (e.g., WiMAX®); a Bluetooth® standard; and so forth. In some implementations, the wireless link 106 may provide power wirelessly, and the electronic device 102 or the base station 104 may comprise a power source.

As shown for some implementations, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The wireless interface device 120 provides connectivity to respective networks and peer devices via a wireless link, which may be configured similar to or differently from the wireless link 106. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like.

As shown, the wireless interface device 120 includes at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem baseband processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

As shown, the transceiver 126 includes at least the locked loop 130. The transceiver 126 can also include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a superheterodyne architecture). The frequency translation can be accomplished using a mixer (not shown in FIG. 1) in conjunction with the locked loop 130. Generally, the transceiver 126 includes filters, switches, amplifiers, mixers, and so forth for routing and conditioning signals that are transmitted or received via the antenna 122.

The transceiver 126 can further include other components, such as an analog-to-digital converter (ADC) or a digital-to-analog converter (DAC). In operation, an ADC can convert from analog signals to digital signals, and a DAC can convert from digital signals to analog signals. Generally, an ADC or a DAC can be implemented as part of the communication processor 124, as part of the transceiver 126, or separately from both of them (e.g., as another part of an SoC or as part of the application processor 108).

Figure 2:
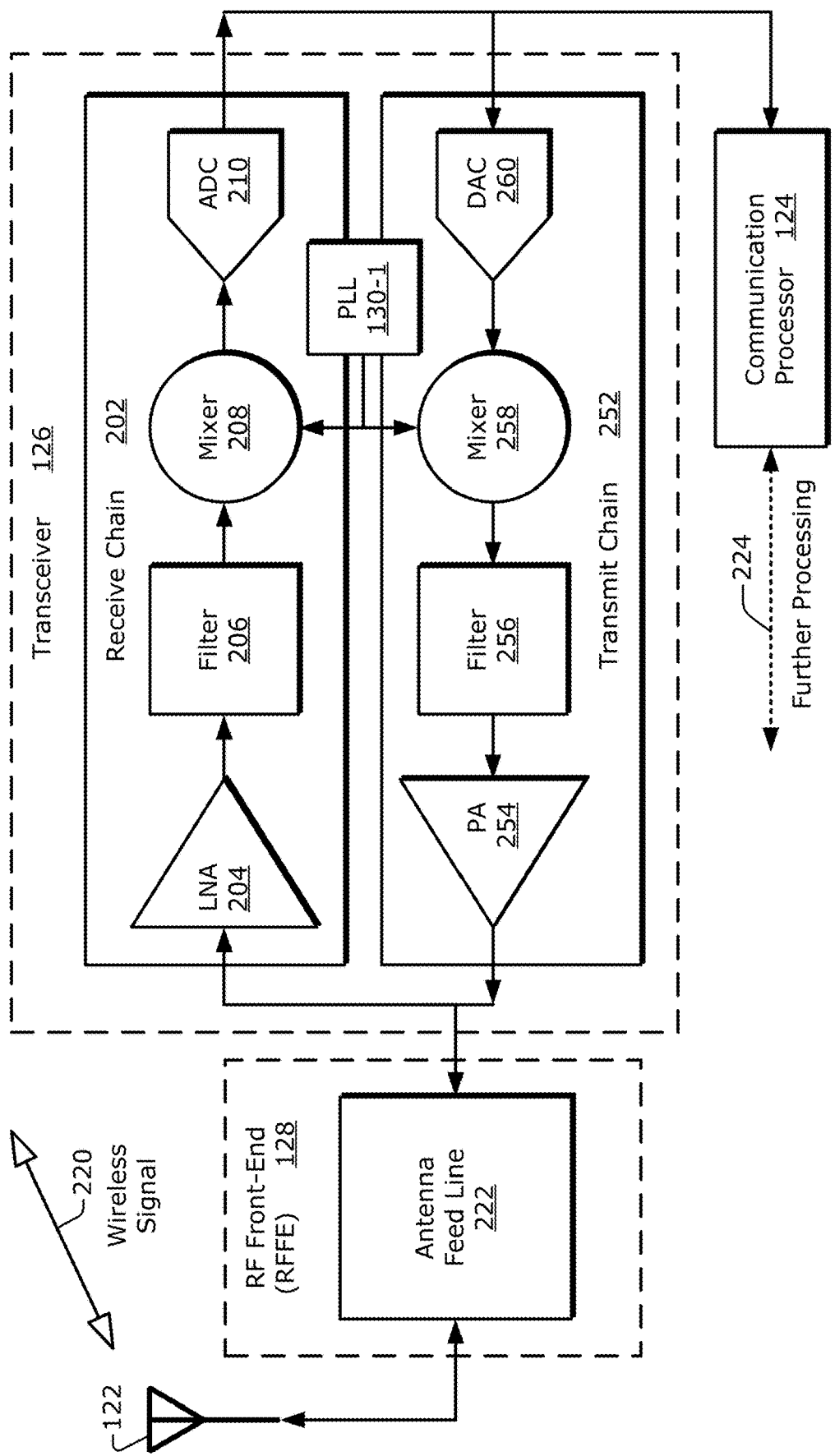
FIG. 2 illustrates an example transceiver including a phase-locked loop (PLL) that uses a charge pump with a voltage-tracking function to increase a bandwidth of the PLL.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters, switches, or amplifiers for conditioning signals received via the antenna 122 or signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, the locked loop 130 is depicted as being part of a transceiver 126. Described implementations of a locked loop 130 can, however, additionally or alternatively be employed in other portions of the wireless interface device 120 (e.g., as part of the communication processor 124 or the RF front-end 128) or in other portions of the electronic device 102 generally (e.g., as a clock generator or other frequency synthesizer of the application processor 108 or an SoC). Additional aspects of the wireless interface device 120 regarding the transceiver 126 and the RF front-end 128 are described below with reference to FIG. 2. Example PLL 130-1 implementations of the locked loop 130 are described below with reference to FIGS. 2 and 3. For example, the charge pump 132, the buffer 134, and the filter 136 are described below with reference to FIG. 3. For brevity, some aspects of a charge pump with voltage tracking are described herein in terms of a PLL 130-1 (e.g., of FIGS. 2 and 3); however, the principles are applicable to locked loops generally, including DLLs.

Figure 3:
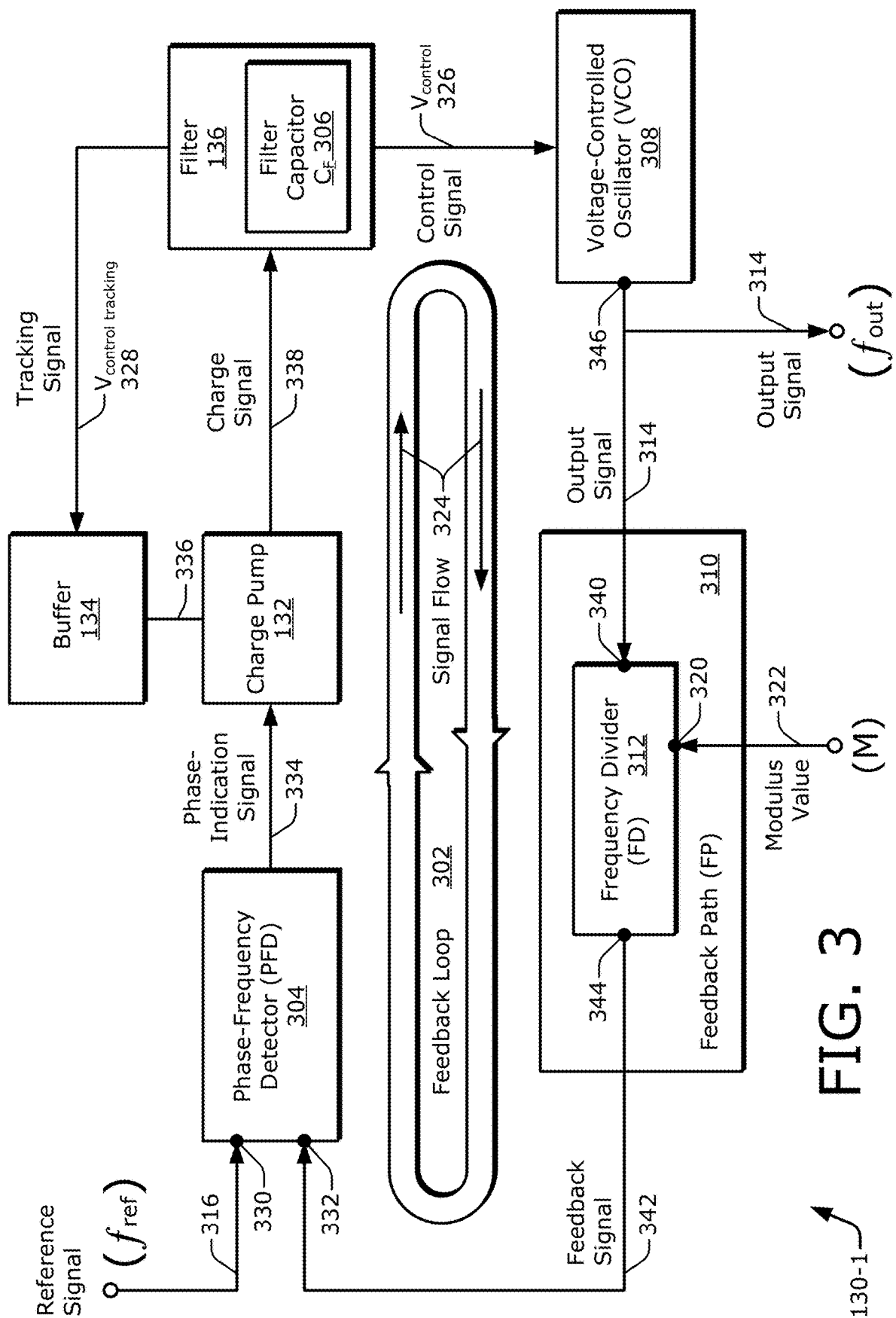
FIG. 3 illustrates an example PLL that includes a phase-frequency detector (PFD), a charge pump, a buffer, a filter, a voltage-controlled oscillator (VCO), and a feedback path.

FIG. 2 illustrates, at 200 generally, an example transceiver 126 that includes a PLL 130-1 that utilizes the charge pump 132, the buffer 134, and the filter 136 (each of FIGS. 1 and 3). Although some description herein is focused on the PLL 130-1, it is to be understood that any locked loop (e.g., a DLL as well as a PLL) may include the charge pump 132, the buffer 134, and the filter 136. In addition to the transceiver 126, FIG. 2 further depicts the antenna 122, the RF front-end 128, and the communication processor 124. The communication processor 124 communicates one or more data signals to other components, such as the application processor 108 of FIG. 1, for further processing at 224 (e.g., for processing at an application level).

As illustrated from left to right, the antenna 122 is coupled to the RF front-end 128, and the RF front-end 128 is coupled to the transceiver 126. The transceiver 126 is coupled to the communication processor 124. The example RF front-end 128 includes at least one antenna feed line 222. The example transceiver 126 includes at least one receive chain 202 and at least one transmit chain 252. Although only one RF front-end 128, one transceiver 126, and one communication processor 124 are shown at 200, an electronic device 102, or a wireless interface device 120 thereof, can include multiple instances of any or all such components. Also, although only certain components are explicitly depicted in FIG. 2 and are shown coupled together in a particular manner, the transceiver 126 may include other non-illustrated components, more or fewer components, differently coupled arrangements of components, and so forth.

In some implementations, the RF front-end 128 couples the antenna 122 to the transceiver 126 via the antenna feed line 222. In operation, the antenna feed line 222 propagates a signal between the antenna 122 and the transceiver 126. During or as part of the propagation, the antenna feed line 222 conditions the propagating signal. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or an antenna feed line 222 thereof, may include one or more other components, such as a filter, an amplifier (e.g., a power amplifier or a low-noise amplifier), an N-plexer, a phase shifter, and so forth.

In some implementations, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a mixer 208 for frequency down-conversion, and an ADC 210. The transmit chain 252 includes a power amplifier 254 (PA 254), a filter 256, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically disposed anywhere along the depicted receive and transmit chains.

The receive chain 202 is coupled between the antenna feed line 222 of the RF front-end 128 and the communication processor 124, e.g., via the low-noise amplifier 204 and the ADC 210, respectively. The transmit chain 252 is coupled between the antenna feed line 222 and the communication processor 124, e.g., via the power amplifier 254 and the DAC 260, respectively. The transceiver 126 can also include at least one PLL 130-1. For example, the transceiver 126 can include one PLL 130-1 for each transmit/receive chain pair, one PLL 130-1 per transmit chain and one PLL 130-1 per receive chain, multiple PLLs 130-1, and so forth. In some implementations, a PLL 130-1 is implemented in the RF front-end 128 or coupled to the RF front-end 128 (e.g., to a mixer therein), instead of or in addition to being coupled to the receive chain 202 and/or the transmit chain 252 of the transceiver 126.

As shown for the receive chain 202, the antenna 122 is coupled to the low-noise amplifier 204 via the antenna feed line 222, and the low-noise amplifier 204 is coupled to the filter 206. The filter 206 is coupled to the mixer 208, and the mixer 208 is coupled to the ADC 210. The ADC 210 is in turn coupled to the communication processor 124. As shown for the transmit chain 252, the communication processor 124 is coupled to the DAC 260, and the DAC 260 is coupled to the mixer 258. The mixer 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components.

As part of an example signal-receiving operation, the filter 206 provides a filtered signal to the mixer 208. The mixer 208 performs a frequency conversion operation on the filtered signal to down-convert from one frequency to a lower frequency (e.g., from a radio frequency (RF) to an intermediate frequency (IF) or to a baseband frequency (BBF)). The mixer 208, or multiple such mixers (which may be implemented in the transceiver 126 or distributed between the transceiver 126 and the RF front-end 128), can perform the frequency down-conversion in a single conversion step or through multiple conversion steps using at least one PLL 130-1 that generates a signal having a synthesized frequency. Thus, the mixer 208 accepts the filtered signal and performs a frequency down-conversion operation on the filtered signal to produce a down-converted signal using a signal from the PLL 130-1. The mixer 208 can also provide the down-converted signal to the ADC 210 for conversion and forwarding to the communication processor 124.

As part of an example signal-transmitting operation, the mixer 258 accepts an analog signal at BBF or IF from the DAC 260. The mixer 258 upconverts the analog signal to a higher frequency, such as an RF frequency, to produce an RF signal using a signal generated by the PLL 130-1 to have a target synthesized frequency. The mixer 258 provides the RF signal to the filter 256. After filtering by the filter 256, the power amplifier 254 provides an amplified signal to the antenna feed line 222 for signal conditioning. The RF front-end 128 uses the antenna feed line 222 to provide the conditioned signal to the antenna 122 for emanation as a wireless signal 220.

Although the mixer 258 is described above as being implemented by the transceiver 126 for up-conversion, a plurality of mixers for up-conversion may be distributed between the transceiver 126 and the RF front-end 128. Further, each such up-conversion mixer may be coupled to or implemented in combination with a PLL 130-1 as described herein. Similarly, one or more other down-conversion mixers, instead of or in addition to the mixer 208, may be implemented in the RF front-end 128. Each of these down-conversion mixers may also be coupled to or implemented in combination with a PLL 130-1 as described herein.

The PLL 130-1 is depicted in FIG. 2 as being part of a transceiver 126 to support frequency translation or modulation operations by a mixer of at least one transmit or receive chain. Nonetheless, a PLL 130-1 (or another locked loop 130) can be deployed in other portions of an electronic device (e.g., in the RF front-end 128 or in the application processor 108 of FIG. 1), can be used in other manners or to provide other functionality, can be coupled to different components (e.g., to a radar generator or a clock tree), and so forth. Examples of such functionality include radar signal generation, signal demodulation, clock multiplication, and the like.

FIG. 3 illustrates an example feedback loop 302 of a PLL 130-1. Described implementations may, however, be implemented with different types of locked loops (e.g., a DLL instead of a PLL) and different types of PLLs (e.g., a digital PLL, a sampling PLL, a sub-sampling PLL, and so forth). As shown, the PLL 130-1 includes a phase-frequency detector 304 (PFD 304), a charge pump 132, a buffer 134, a filter 136 (e.g., a loop filter) having at least one filter capacitor 306 ($C_F$ 306), a voltage-controlled oscillator 308 (VCO 308), and a feedback path 310 (FP 310). The feedback path 310 can include a frequency divider 312 (FD 312).

FIG. 3 also illustrates certain example input and output signals and nodes of the PLL 130-1. These include a reference signal 316 with a reference frequency $f_{ref}$ and an output signal 314 with an output frequency $f_{out}$. A control input node 320 of the frequency divider 312 receives a modulus value 322 ("M"). Although not shown in FIG. 3, the frequency divider 312 can include at least one sigma-delta modulator (SDM) that operates responsive to the modulus value 322 "M."

The feedback loop 302 of the PLL 130-1 operates in accordance with a signal flow 324, which follows a clockwise direction as depicted in FIG. 3. Starting at the top-left corner of FIG. 3, the phase-frequency detector 304 includes a reference input node 330 and a feedback input node 332. The reference input node 330 accepts the reference signal 316. The phase-frequency detector 304 is coupled to the charge pump 132 and provides a phase-indication signal 334 to the charge pump 132. The charge pump 132 is coupled to the buffer 134 via a signal 336, which is described below. The charge pump 132 is also coupled to the filter 136, and the charge pump provides a charge signal 338 to the filter 136.

The filter 136 is coupled to the VCO 308 and provides a control signal $V_{control}$ 326 thereto. The VCO 308 is coupled to the frequency divider 312, and the VCO 308 provides the output signal 314 to the frequency divider 312. The frequency divider 312 includes a divider input node 340 to receive the output signal 314 and a divider output node 344. The frequency divider 312 produces a feedback signal 342 based on the output signal 314 and a divider value, which may be derived from the modulus value 322. The frequency divider 312 provides the feedback signal 342 to the feedback input node 332 of the phase-frequency detector 304 via the divider output node 344. In addition to the VCO 308, an output of the filter 136 is coupled to the buffer 134. The filter 136 provides a tracking signal $V_{control\ tracking}$ 328 to the buffer 134. Based at least partly on the signal 336, the tracking signal 328 ($V_{control\ tracking}$ 328) enables the charge pump 132 to utilize a voltage-tracking function to widen a bandwidth of the PLL 130-1, as is further described below.

In example implementations, the feedback loop 302 of the PLL 130-1 utilizes a negative feedback path as part of the signal propagation loop. The following description of the feedback loop 302 starts at the top-left corner of FIG. 3 at the phase-frequency detector 304 and continues in a clockwise direction. The phase-frequency detector 304 accepts the reference signal 316 and the feedback signal 342. From the phase-frequency detector 304, signal flow of the feedback loop 302 continues to the charge pump 132 with the phase-indication signal 334. From the charge pump 132, the signal flow extends to the filter 136 with the charge signal 338.

Continuing with the feedback loop 302, the filter 136 provides the control signal $V_{control}$ 326 to the VCO 308. The VCO 308 produces the output signal 314 at the voltage output node 346 for the PLL 130-1 based on the control signal $V_{control}$ 326. The output signal 314 is also fed back to the phase-frequency detector 304, via the frequency divider 312, as part of the feedback path 310 that includes the feedback signal 342.

In an example operation, the phase-frequency detector 304 produces the phase-indication signal 334 based on a phase difference between the reference signal 316 and the feedback signal 342. The charge pump 132 accepts the phase-indication signal 334, which is indicative of the phase difference and therefore how much the feedback signal 342 is deviating from the reference signal 316. The charge pump 132 operates based on the phase-indication signal 334. The charge pump 132 produces the charge signal 338 to lock the loop to the reference signal 316 based on the phase-indication signal 334. The charge pump 132 utilizes the buffer 134, the filter 136, and the tracking signal $V_{control\ tracking}$ 328 to widen the bandwidth of the PLL 130-1 to accommodate the noise (e.g., in-band noise) of the VCO 308, as is further described below. Example implementations of the phase-frequency detector 304 and the charge pump 132 are described in FIGS. 4-1 and 4-2.

Figures 1, 4:
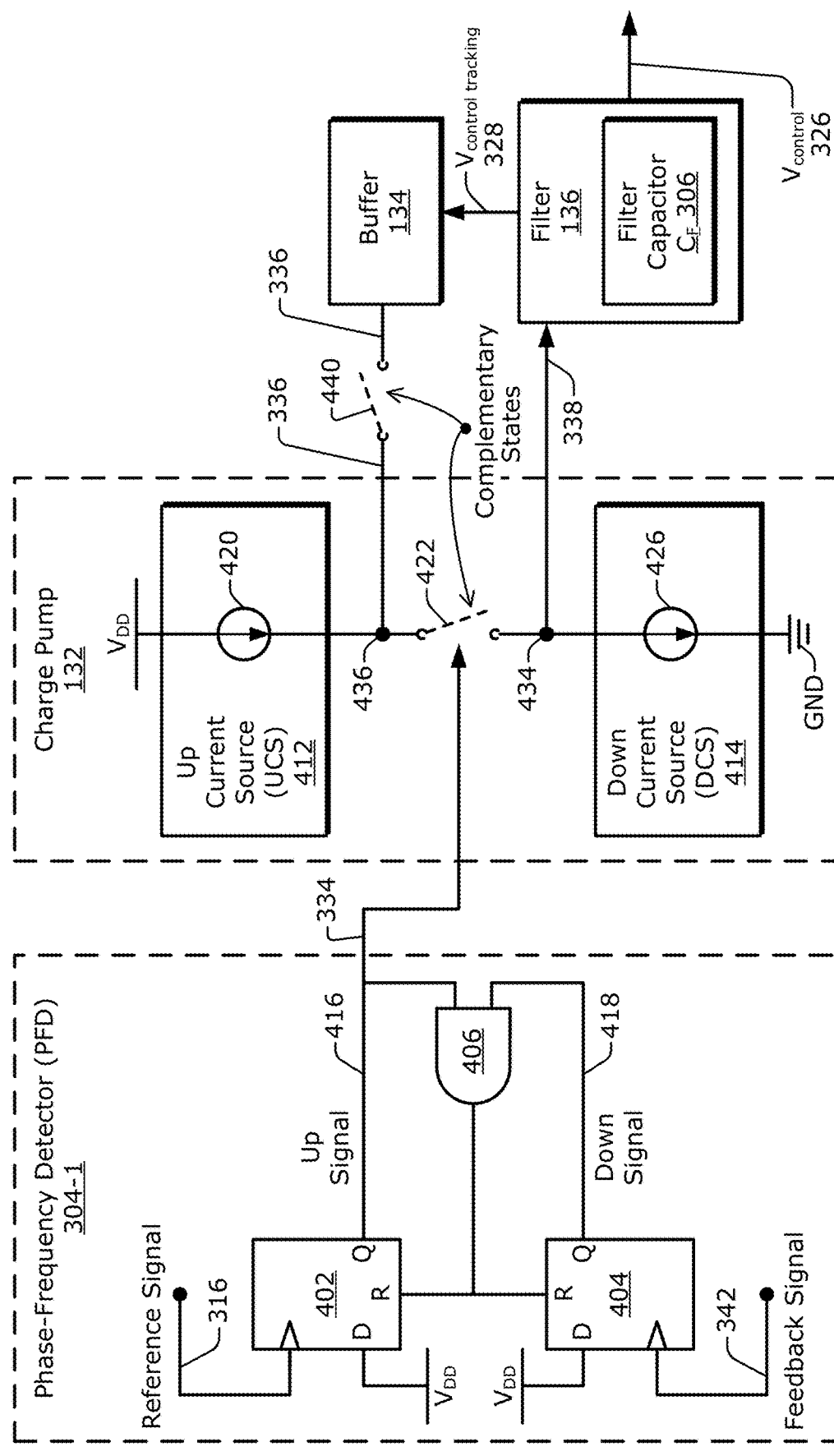
Figures 2, 4:
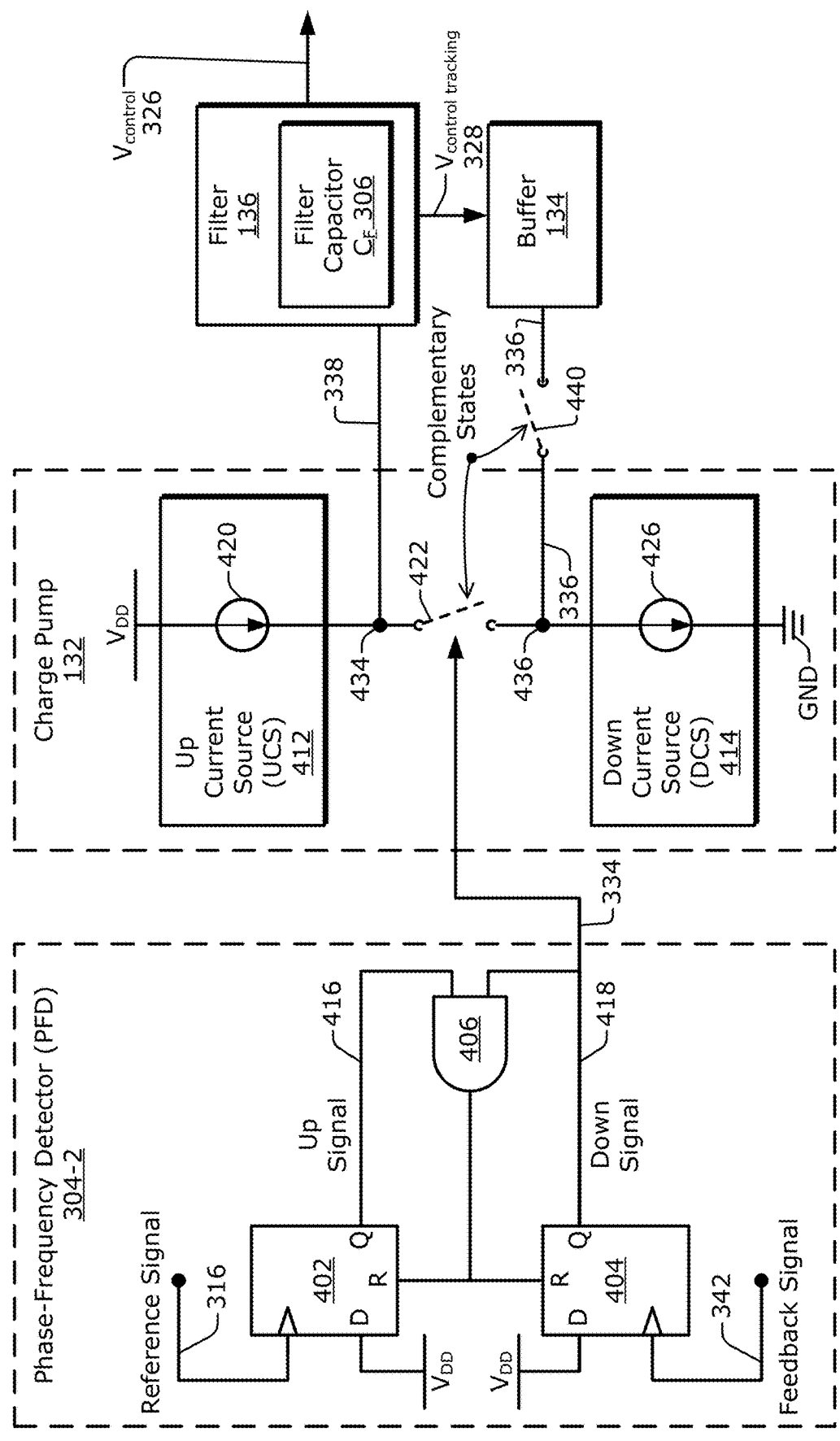

FIG. 4-1 illustrates an example schematic diagram 400-1 of a phase-frequency detector 304-1 (PFD 304-1) and a charge pump 132 in conjunction with a buffer 134, a filter 136, and a switch 440. As illustrated in FIG. 4-1, the phase-frequency detector 304-1 includes an AND gate 406 and two "D" flip-flops: a flip-flop 402 and a flip-flop 404. Although not explicitly shown, the phase-frequency detector 304-1 can also include one or more buffers to provide the phase-indication signal 334 to the charge pump 132. Each D-type flip-flop in FIG. 4-1 includes a "D" input (D-input), a "Q" output (Q-output), a clocking input (">"), and a reset terminal (R). The AND gate 406 includes a first input, a second input, and an output.

In example implementations, the D-input of the flip-flop 402 is coupled to a supply voltage ($V_{DD}$). The reference signal 316 is coupled to the clocking input of the flip-flop 402. The Q-output of the flip-flop 402 produces an up signal 416 of the phase-frequency detector 304-1 that is provided to the charge pump 132 as at least part of the phase-indication signal 334 (also of FIG. 3). The up signal 416 is further coupled to the first input of the AND gate 406. The output of the AND gate 406 is coupled to the reset terminal (R) of the flip-flop 402.

The D-input of the flip-flop 404 is also coupled to a supply voltage ($V_{DD}$). The feedback signal 342 is coupled to the clocking input of the flip-flop 404. The Q-output of the flip-flop 404 produces a down signal 418 of the phase-frequency detector 304-1. To mitigate some of the charge-sharing issues between the charge pump 132 and the filter 136, the down signal 418 of the phase-frequency detector 304-1 is not provided to the charge pump 132 like the up signal 416 of the phase-frequency detector 304-1. The impact of this difference between the up and down signals and the result on the down current source 414 are described below (e.g., with reference to FIGS. 6-1, 6-2, and 7). The down signal 418 is coupled to the second input of the AND gate 406. The output of the AND gate 406 is also coupled to the reset terminal (R) of the flip-flop 404.

In example operations, the two edge-triggered clocking inputs of the flip-flops 402 and 404 work in conjunction with the D-inputs and the reset terminals (R) of the two flip-flops. The flip-flops 402 and 404 use an "internal" feedback path that is internal to the phase-frequency detector 304-1. This internal feedback path includes the AND gate 406 and at least the up signal 416. When the reference signal 316 and the feedback signal 342 are both high, the previous rising edge of these two signals causes both the up signal 416 and the down signal 418 to be high because the D-inputs are tied high to the supply voltage(s) ($V_{DD}$). This causes the AND gate 406 to output a high signal, which acts as a reset signal that triggers the respective reset terminal (R) of the flip-flop 402 and the flip-flop 404.

Responsive to a rising edge of the reset signal at the respective reset terminal (R), the flip-flop 402 changes the corresponding Q-output to be low, and this causes the up signal 416 to have a low value. Similarly, the flip-flop 404 changes the corresponding Q-output to be low; thus, the down signal 418 has a low value responsive to a rising edge of the reset signal at the respective reset terminal (R) of the flip-flop 404. Whichever incoming signal, either the reference signal 316 or the feedback signal 342, goes high first, the signal at the Q-output of the corresponding flip-flop will likewise be driven high, either the up signal 416 or the down signal 418, respectively. The output signal that goes high first will remain high until the other incoming signal goes high, thereby causing the AND gate 406 to trigger both the reset terminals (R). Although a particular phase-frequency detector 304-1 implementation is depicted in FIG. 4-1 and described above, a charge pump that utilizes voltage tracking can be employed with different phase-frequency detector implementations, for example, as is illustrated in FIG. 4-2 and described further below.

As is illustrated in FIG. 4-1, the charge pump 132 includes an up current source 412 (UCS 412), a down current source 414 (DCS 414), and a switch 422. The up current source 412 (e.g., a first current source) and the down current source 414 (e.g., a second current source) are coupled together in series between two power distribution nodes: a supply voltage ($V_{DD}$) on one side and a ground (GND) on the other side Thus, each power distribution node can correspond to a voltage supply node or a ground node. As shown, the up current source 412 is coupled to the supply voltage ($V_{DD}$), and the down current source 414 is coupled to the ground (GND). The up current source 412 includes a current source 420. The switch 422 is coupled in series between the up current source 412 and the down current source 414. This switch may be referred to herein as a first switch 422. During example operations (e.g., corresponding to those of FIGS. 6-1, 6-2, and 7), the up current source 412 can be switchably providing a current to the filter 136 or the buffer 134 depending on the states of one or more switches, such as the first switch 422. If the first switch 422 is in a closed state, for instance, as is detailed in FIGS. 6-1, 6-2, and 7, the provided current can increase a voltage of the filter 136. In FIG. 4-1, the up current source 412 (e.g., a first current source) operates as a switched current source relative to the filter 136. Further, the up current source 412 (e.g., the first current source) is coupled between a supply voltage and the first switch 422.

The down current source 414 includes a current source 426. During example operations (e.g., corresponding to those of FIGS. 6-1, 6-2, and 7), the down current source 414 can be drawing or withdrawing a current from the filter 136, such as from the filter capacitor $C_F$ 306. The withdrawn current can decrease the voltage of the loop filer 136. This current withdrawal need not be governed by a switch in some implementations. Hence, current through the current source 426 may be constantly "leaking" during these example operations, or otherwise while the locked loop 130 is operating. In FIG. 4-1, the down current source 414 (e.g., a second current source) operates as an unswitched current source relative to the charge pump 132 by applying current to (e.g., providing current to or drawing current from) the filter 136. Further, the down current source 414 (e.g., the second current source) is coupled between the first switch 422 and a ground. This "leaking" current may be pulled from the filter 136, thereby mitigating some of the charge-sharing issues that occur during phase shifting.

In example implementations, the charge pump 132 includes two nodes: a first node 436 and a second node 434. In FIG. 4-1, the first node 436 is electrically positioned between the current source 420 and the first switch 422. The second node 434 is electrically positioned between the first switch 422 and the current source 426. The filter 136 is coupled to the charge pump 132 between the first switch 422 and the current source 426 at the second node 434. The second switch 440 is coupled to the charge pump 132 between the current source 420 and the first switch 422 at the first node 436. The second switch 440 is coupled between the first node 436 and the buffer 134. Thus, the buffer 134 is switchably coupled to the charge pump 132 between the current source 420 and the first switch 422 at the first node 436 via the second switch 440.

The first switch 422 is depicted with small-dashed lines to connote an undefined state. In some other drawings, such as FIGS. 8-1 and 8-2, switches may be depicted with a solid line in a particular example state (e.g., "open" or "closed"). In an example aspect, as is illustrated in FIG. 4-1, a state of the first switch 422 may be controlled by the up signal 416, which corresponds to the phase-indication signal 334 of FIG. 3 in this example. In another example aspect, however, a state of the first switch 422 may be controlled by the down signal 418 (instead of the up signal 416), as is further described below with reference to FIG. 4-2.

In FIG. 4-1, if the up signal 416 is high, the first switch 422 is closed and the second switch 440 is opened. The first switch 422 and the second switch 440 are operated to have complementary states. For example, if the first switch 422 is in an open state, the second switch 440 is in a closed state. Similarly, if the first switch 422 is closed, then the second switch 440 is open. Thus, a state of the second switch 440 of FIG. 4-1 may also be controlled by the up signal 416.

If the first switch 422 is closed for a first example operational phase, current from the current source 420 can flow from the first node 436 to the second node 434. This current can then flow from the second node 434 to the filter 136 via the charge signal 338. A portion of this current from the current source 420 can also flow to ground via the current source 426. Further, if the first switch 422 is closed, current from the first node 436 cannot flow to the buffer 134 because the second switch 440 is opened to disable flow of current due to the complementary states of the two switches. On the other hand, if the up signal 416 of FIG. 4-1 is low, the first switch 422 is opened and the second switch 440 is closed for a second example operational phase. This condition enables a flow of the current from the current source 420 to the buffer 134 via the first node 436 and the closed second switch 440. The operation of these switches and the resulting current flows and voltage levels are described further below, for example, with reference to FIG. 6-1. Next, however, this document describes another example implementation of the phase-frequency detector 304, the charge pump 132, the buffer 134, and the filter 136.

FIG. 4-2 illustrates an example schematic diagram 400-2 of an example phase-frequency detector 304-2 (PFD 304-2) and a charge pump 132 in conjunction with a buffer 134 and a filter 136. FIG. 4-2 is described in the context of FIGS. 1 to 4-1, the electronic device 102, the locked loop 130 (e.g., the PLL 130-1), the phase-frequency detector 304 of FIG. 3, and the phase-frequency detector 304-1 of FIG. 4-1. The phase-frequency detector 304-2 of FIG. 4-2 may include similar circuitry as that of the phase-frequency detector 304-1 of FIG. 4-1. Unlike the phase-frequency detector 304-1, however, the phase-frequency detector 304-2 provides the down signal 418 (instead of the up signal 416) to the charge pump 132 as part of the phase-indication signal 334. To mitigate some of the charge-sharing issues between the charge pump 132 and the filter 136, the up signal 416 is not provided to the charge pump 132 like the down signal 418.

As in FIG. 4-1, the charge pump 132 of FIG. 4-2 includes two nodes: a first node 436 and a second node 434. Unlike in FIG. 4-1, however, the up current source 412 (instead of the down current source 414) is implemented as a "constantly leaking" current source. To do so, in part, the buffer 134 and the filter 136 in FIG. 4-2 are coupled at different nodes (e.g., the nodes 436 and 434) of the charge pump 132 as compared to FIG. 4-1. Specifically, in FIG. 4-2, the filter 136 is coupled to the charge pump 132 at the first node 436 (instead of the second node 434). The second switch 440 is coupled to the charge pump 132 between the current source 426 and the first switch 422 at the second node 434 (instead of at the first node 436). The second switch 440 is coupled between the second node 434 and the buffer 134. Thus, the buffer 134 is switchably coupled to the charge pump 132 between the current source 426 and the first switch 422 at the second node 434 via the second switch 440.

For both of FIGS. 4-1 and 4-2, the first current source can be switchably coupled to the filter 136, and the second current source may be unswitchably coupled to the filter 136 to enable constant current leaking, including by having a switch that is closed while the locked loop 130 is operational, regardless of the up signal 416 or the down signal 418. Thus, the second current source can be configured to leak current with respect to the filter 136 while the locked loop 130 is operational. In contrast with FIG. 4-1, in FIG. 4-2 the down current source 414 (e.g., a first current source) operates as a switched current source relative to the filter 136. Further, the down current source 414 (e.g., the first current source) is coupled between the first switch 422 and the ground. The up current source 412 (e.g., a second current source) operates as an unswitched current source relative to the filter 136 by applying current to (e.g., providing current to or drawing current from) the filter 136 in a constantly leaking manner. Further, the up current source 412 (e.g., the second current source) is coupled between the supply voltage node and the first switch 422.

Like in FIG. 4-1, the first switch 422 of FIG. 4-2 is depicted with small-dashed lines to connote an undefined state. Unlike FIG. 4-1, however, a state of the first switch 422 of FIG. 4-2 is controlled by the down signal 418 (instead of the up signal 416), which corresponds to the phase-indication signal 334 of FIG. 3 in this example. If the down signal 418 of FIG. 4-2 is high, the first switch 422 is closed and the second switch 440 is opened. Like in FIG. 4-1, the first switch 422 and the second switch 440 of FIG. 4-2 are operated to have complementary states. For example, if the first switch 422 is in an open state, the second switch 440 is in a closed state. Similarly, if the first switch 422 is closed, then the second switch 440 is open. Thus, a state of the second switch 440 may also be controlled by the down signal 418. Example operations of the example schematic diagram 400-2 of FIG. 4-2 are further described below with reference to FIGS. 6-3 and 6-4. Next, however, this document describes an example implementation of the buffer 134.

Figure 5:
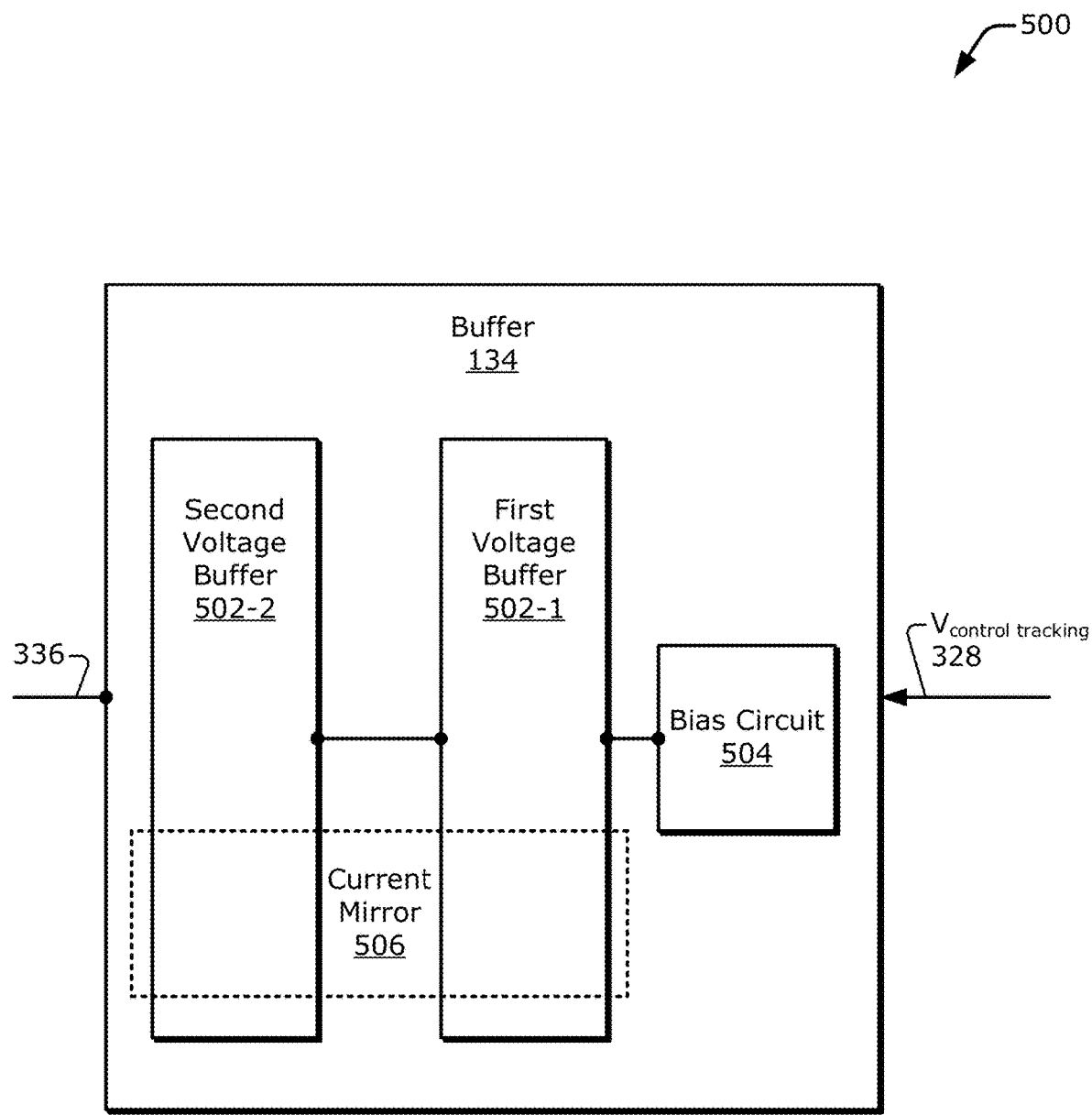
FIG. 5 is a schematic diagram of an example buffer that can contribute to a voltage-tracking function of a locked loop to increase the bandwidth of the locked loop.

FIG. 5 is a schematic diagram 500 of an example buffer 134, which can contribute to the voltage-tracking function of a locked loop to increase the bandwidth of the locked loop. As described above for FIGS. 3, 4-1, and 4-2, the charge pump 132 is coupled to the buffer 134 via the signal 336 and to the filter 136 via the signal 338 (not shown in FIG. 5). Additionally, the filter 136 is coupled to the buffer 134 via the tracking signal $V_{control\ tracking}$ 328. In example implementations, the buffer 134 includes at least one voltage buffer 502. Depending on the technology, the voltage buffer 502 may include at least one source follower or source-follower amplifier (e.g., using CMOS-based technology), at least one emitter follower or emitter-follower amplifier (e.g., using BJT-based technology), and so forth.

As shown in FIG. 5, the buffer 134 includes a first voltage buffer 502-1, a second voltage buffer 502-2, and a bias circuit 504. The first voltage buffer 502-1 can be coupled at least partially in parallel with the second voltage buffer 502-2, as is further described below for FIGS. 6-1, 6-2, 6-3, 6-4, and 7. Each voltage buffer 502 can include at least one voltage amplifier (not shown in FIG. 5). For example, the first voltage buffer 502-1 can include a first voltage amplifier, and the second voltage buffer 502-2 can include a second voltage amplifier. Each voltage amplifier may be implemented using at least one voltage-follower amplifier that can produce an output voltage based on an input voltage with a gain of approximately one.

Figures 1, 6:
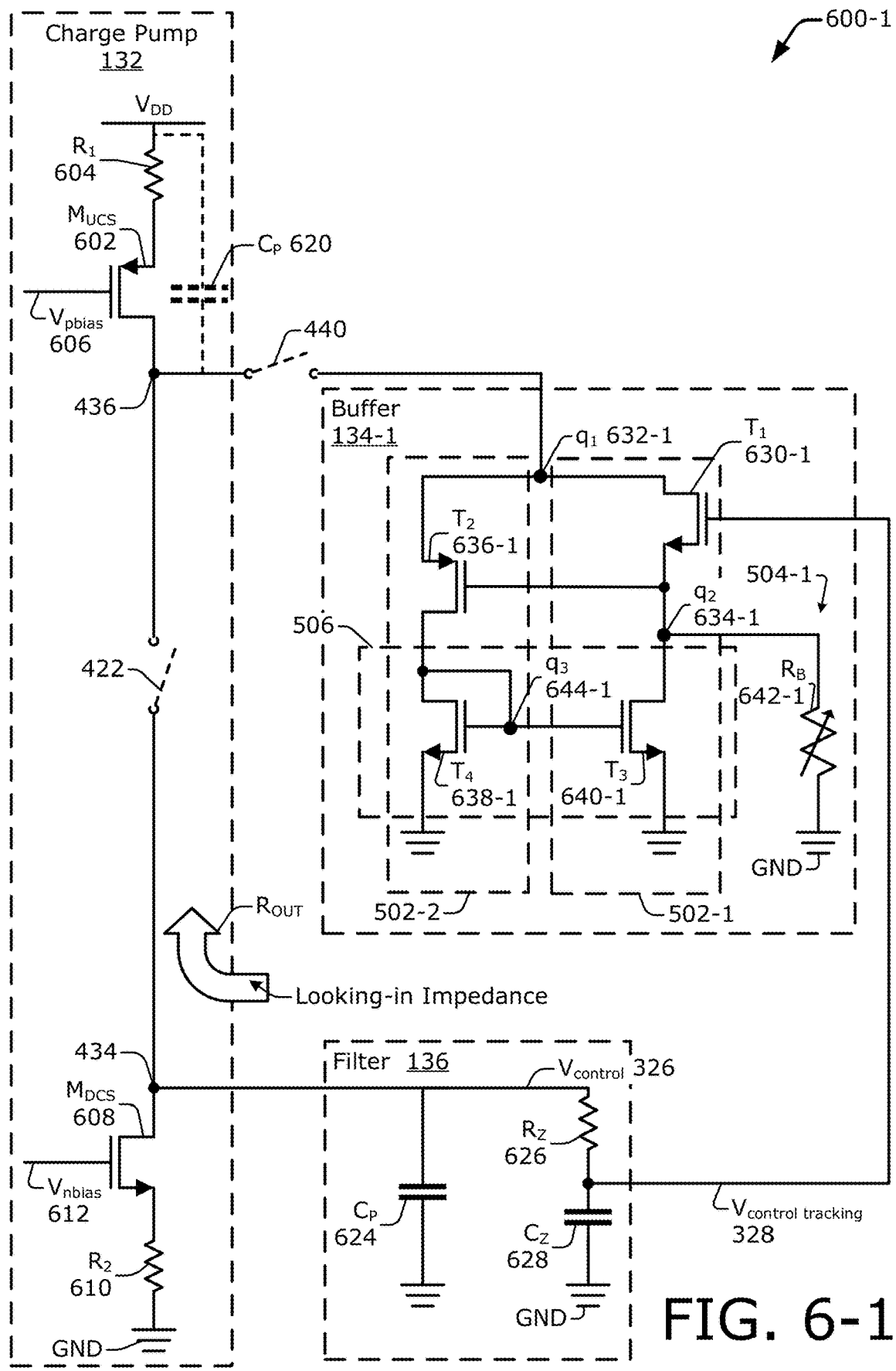
Figures 2, 6:
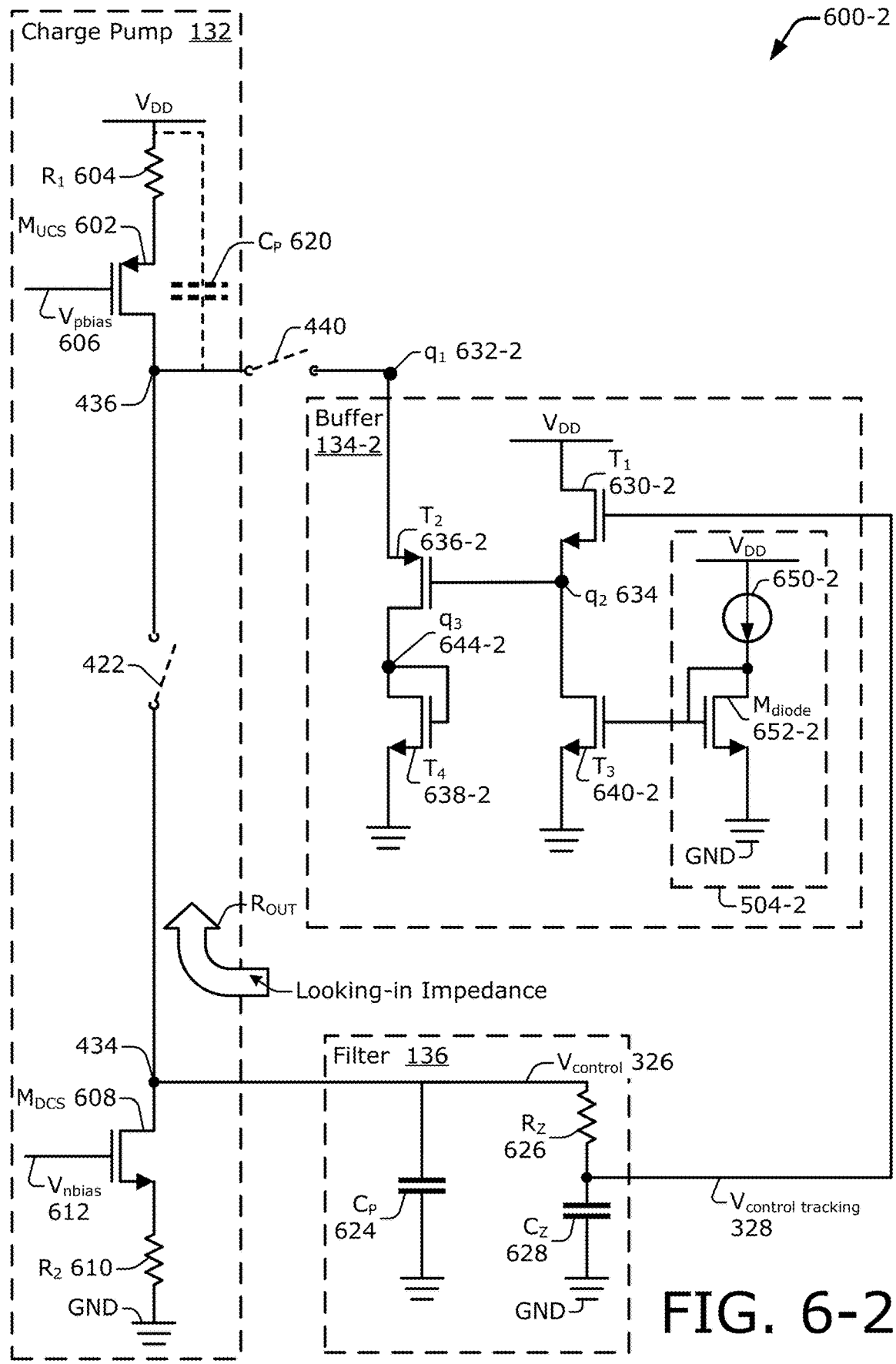
Figures 3, 6:
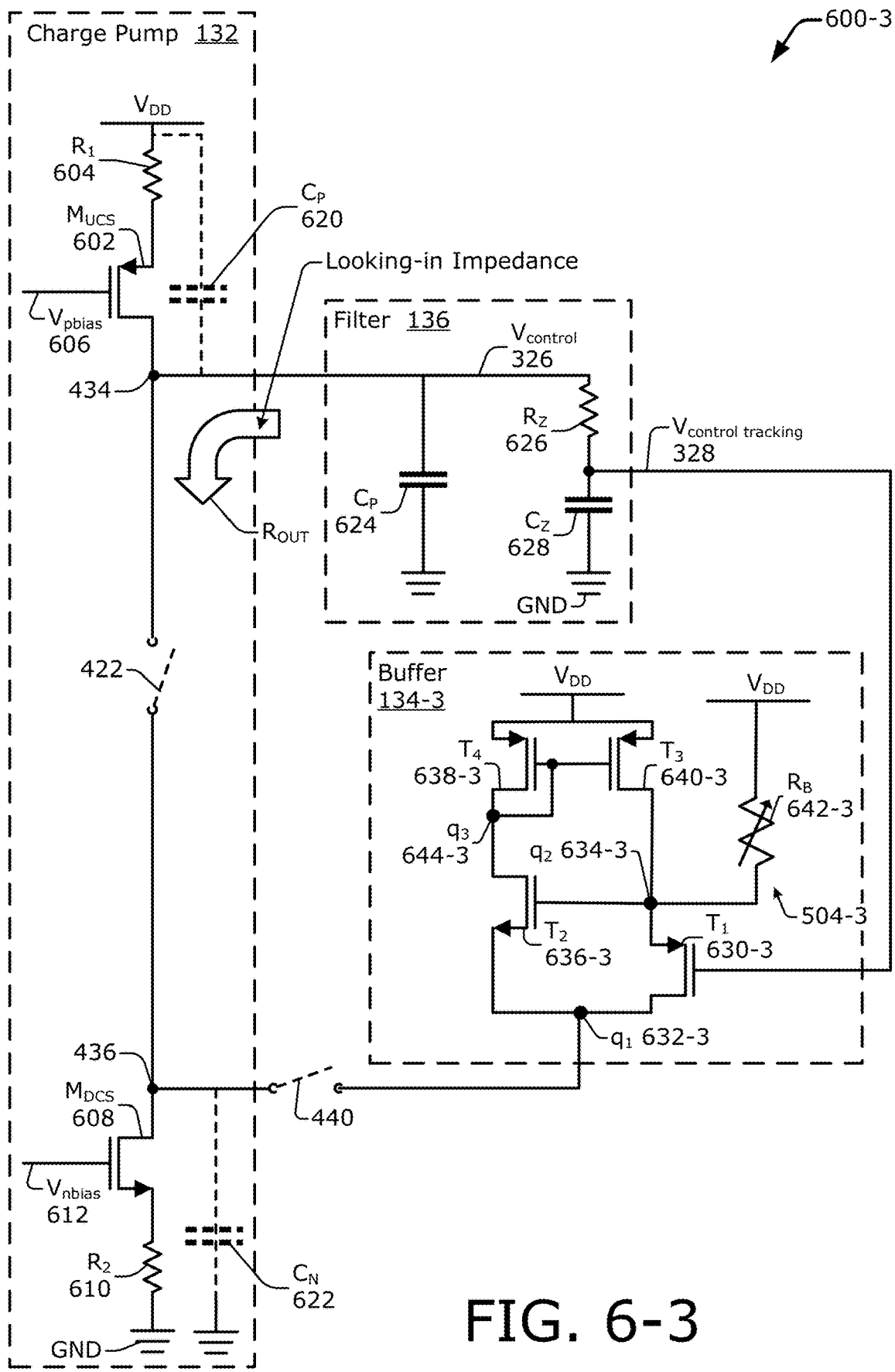
Figures 4, 6:
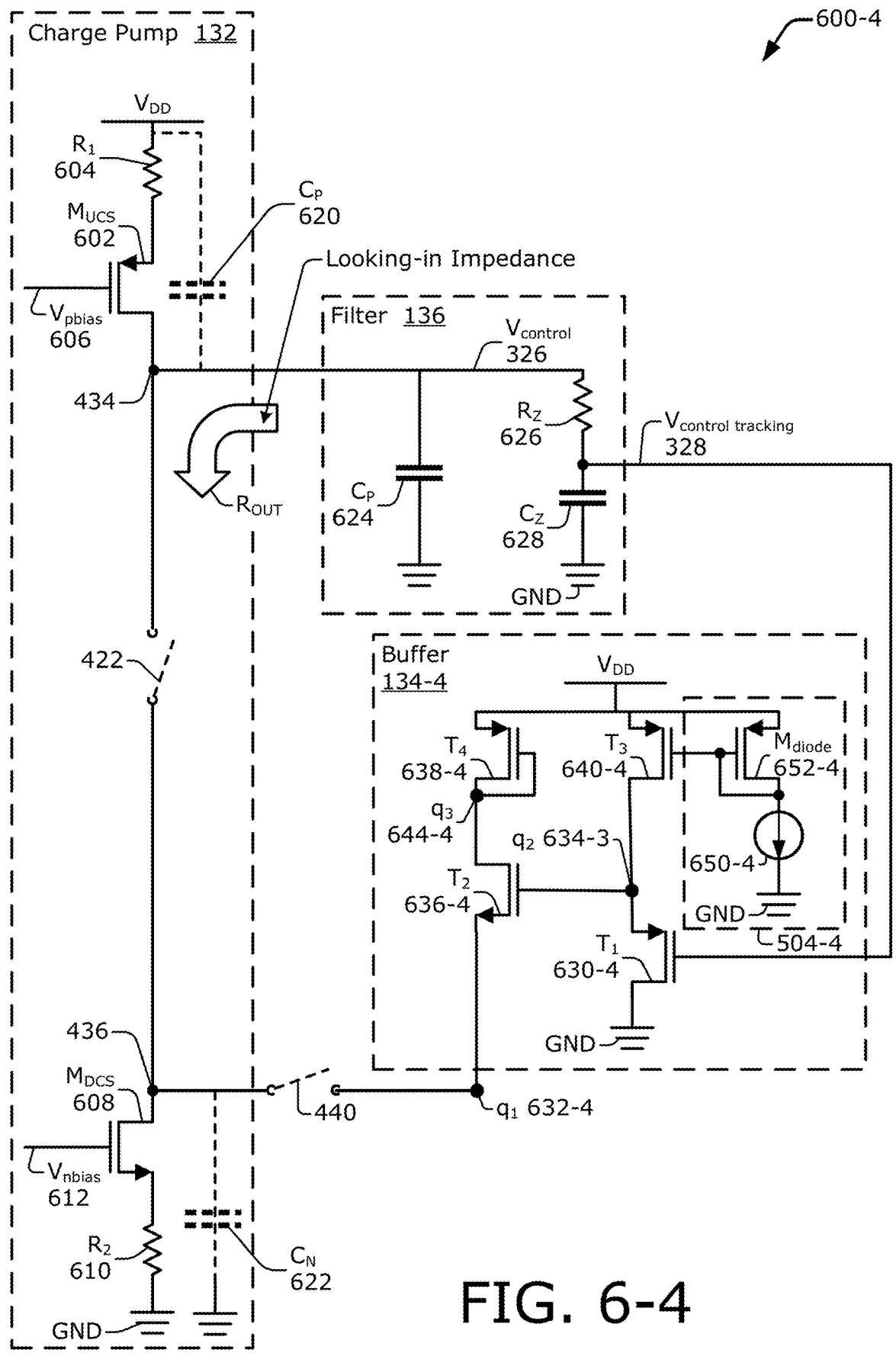

In some implementations (e.g., those of FIGS. 6-1 and 6-3), a current mirror 506 (e.g., a joint current mirror) is distributed across the first voltage buffer 502-1 and the second voltage buffer 502-2. Although not illustrated in FIG. 5, the current mirror 506 includes at least a transistor that is part of the first voltage buffer 502-1 and at least another transistor that is part of the second voltage buffer 502-2. To implement the current mirror 506, one of the voltage buffers can include a diode-connected transistor. The first voltage buffer 502-1 and the second voltage buffer 502-2 can draw a same amount of current by utilizing the current mirror 506 or can draw currents that are scaled relative to each other. Alternatively, a manufacturer can enable the first voltage buffer 502-1 and the second voltage buffer 502-2 to draw different magnitudes of current by omitting the current mirror 506. To do so, the first and second voltage buffers 502-1 and 502-2 can be uncoupled at respective gate terminals of respective transistors, as is illustrated in FIGS. 6-2 and 6-4. In such cases, the first voltage buffer 502-1 may draw more current than the second voltage buffer 502-2, or vice versa, as is described below.

Regardless of whether the buffer 134 includes a current mirror 506, the buffer 134 causes the charge pump 132 to be impacted or affected by the voltage-tracking function. For example, the first voltage buffer 502-1 or the second voltage buffer 502-2 can use at least one transistor (e.g., an FET or a BJT) as a voltage amplifier (e.g., a source-follower amplifier or an emitter-follower amplifier, respectively) to produce a voltage at the second switch 440 (e.g., of FIGS. 4-1 and 4-2) that is based on another voltage at the filter 136. The voltage-tracking function enables an output or a node of the charge pump 132 to track an output voltage of at least the first voltage buffer 502-1. In an example PLL 130-1 implementation, the output voltage of the charge pump 132 corresponds to the voltage of the control signal $V_{control}$ 326 and the input voltage for the VCO 308. Additionally, the filter 136 can filter part of the noise of the control signal $V_{control}$ 326 to produce the tracking signal $V_{control}$ tracking 328, as is further described below. At least a version of the tracking signal $V_{control\ tracking}$ 328 is transferred as the output voltage of the first voltage buffer 502-1. Hence, the voltage-tracking function enables the output voltage of the charge pump 132 to track the output voltage of the VCO 308, via the first voltage buffer 502-1 and after filtering some of the noise (e.g., in-band noise) of the VCO 308.

The voltage-tracking function involves one or more of the first and second voltage buffers 502-1 to 502-2 enabling current flow through the buffer. To ensure that active circuit elements (e.g., n-MOSFETs, p-MOSFETs, NPN BJTs, and PNP BJTs) in the first and second voltage buffers 502-1 and 502-2 enable current to flow, the buffer 134 utilizes the bias circuit 504. Different implementations of the bias circuit are illustrated in and described with reference to FIGS. 6-1 to 6-4. Examples of the bias circuit 504 include resistive implementations (e.g., FIGS. 6-1 and 6-3) and current mirror implementations (e.g., FIGS. 6-2 and 6-4).

The voltage-tracking function enables the buffer 134 to increase an output impedance ($R_{OUT}$) of the charge pump 132. Note that throughout this description, the terms "resistance" and "impedance" may be used interchangeably, without limiting the scope of the description. Example impacts of the voltage-tracking on the output impedance ($R_{OUT}$) of the charge pump 132 are described below with reference to FIGS. 7, 8-1, and 8-2. Increasing the output impedance ($R_{OUT}$) of the charge pump 132 enables the locked loop 130 (e.g., the PLL 130-1) to operate using a wider bandwidth (e.g., approximately two megahertz (2 MHz)). The wider bandwidth of the locked loop 130 accommodates a VCO 308 that is operating with more noise (e.g., greater in-band noise). By enabling a noisier VCO 308, a manufacturer can operate the locked loop 130 while utilizing a VCO 308 that draws a lower current and consumes less power without sacrificing a stability or an accuracy of the locked loop 130.

FIG. 6-1 illustrates an example schematic diagram 600-1 of the charge pump 132 coupled to an example implementation of a buffer 134-1, and an example implementation of, and an example coupling to, a filter 136. FIG. 6-1 is described in the context of the FIGS. 1, 2, 3, and 4-1, the locked loop 130, the phase-frequency detector 304 of FIG. 3, and the phase-frequency detector 304-1 of FIG. 4-1. FIG. 6-1 differs from the example operations of FIG. 4-2. Instead, the example operations of FIG. 4-2 are described below with reference to FIGS. 6-3 and 6-4.

Figure 7:
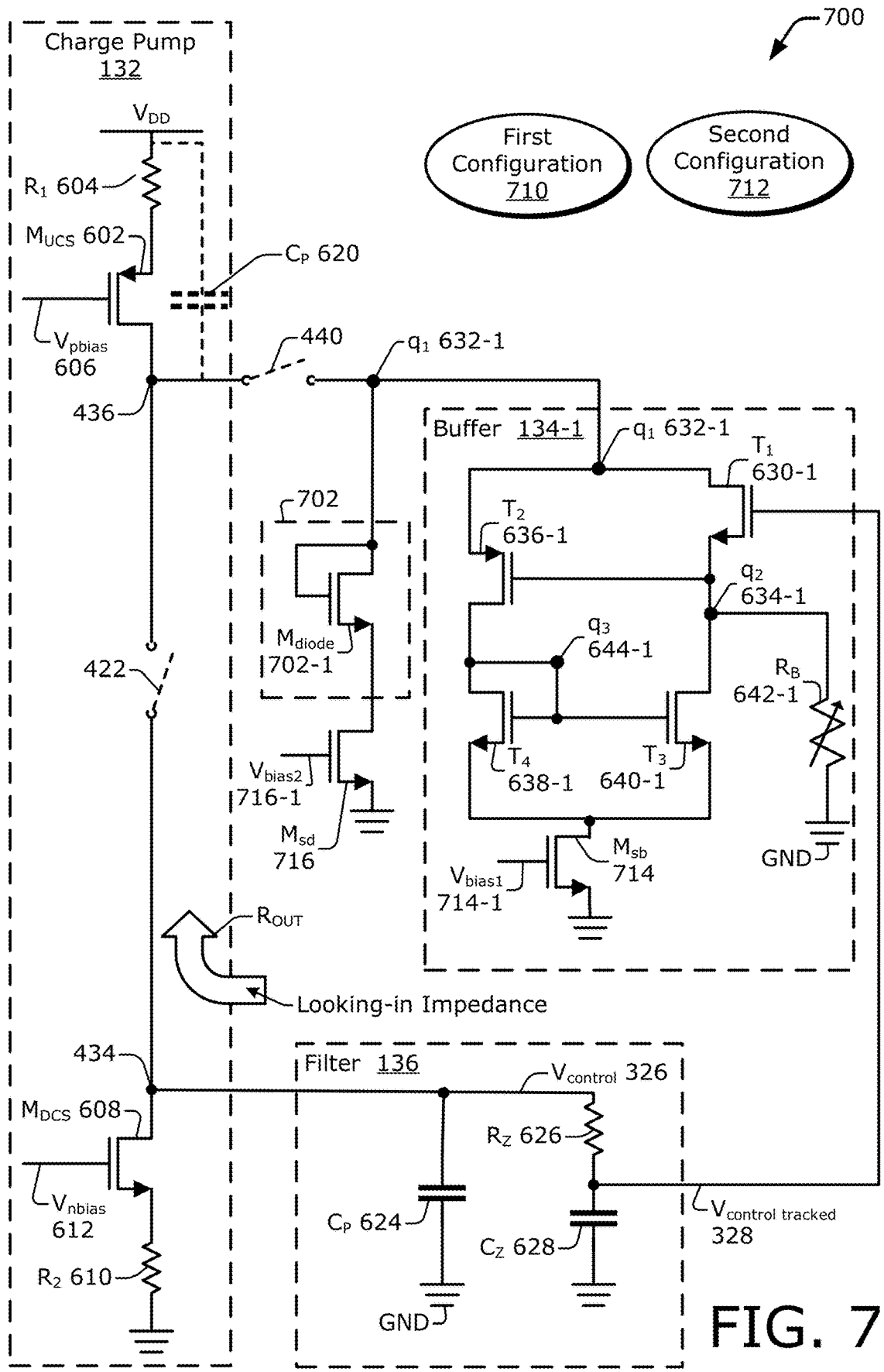
FIG. 7 illustrates an example circuit diagram of a charge pump coupled to a filter, a buffer, and a diode to enable the charge pump to selectively operate in a first or a second configuration.

As is illustrated in FIG. 4-1, the charge pump 132 includes the up current source 412 (UCS 412) and the down current source 414 (DCS 414). Explicit indications of the up current source 412 and the down current source 414 are omitted from FIGS. 6-1 to 7 for clarity. Each transistor depicted in FIGS. 6-1 to 7 is implemented with a field-effect transistor (FET). Example transistors include an n-type metal-oxide-semiconductor field-effect transistor (n-MOSFET) and a p-type metal-oxide-semiconductor field-effect transistor (p-MOSFET). Transistors may, however, be implemented with other types of transistors, such as another type of FET (e.g., a junction FET (JFET)), a bipolar junction transistor (BJT) (e.g., an NPN BJT or a PNP BJT), and so forth. For brevity and continuity, FIGS. 6-1 to 7 illustrate example circuits that include n-MOSFETs and p-MOSFETs. A designer, however, may use the same concepts to build circuits with other types of transistors, such as NPN BJTs, PNP BJTs, and so forth.

The up current source 412 of the charge pump 132 may be implemented using a first transistor, such as a p-MOSFET 602 ($M_{UCS}$ 602). The charge pump 132 can also include the first switch 422 having a first terminal and a second terminal and a first resistor 604 (resistor 604 or $R_1$ 604) having a first terminal and a second terminal. The first terminal of the resistor 604 is coupled to a supply voltage ($V_{DD}$), and the second terminal of the resistor 604 is coupled to a source of the p-MOSFET 602. The first terminal of the first switch 422 is coupled to a drain of the p-MOSFET 602. The charge pump 132 (or other circuitry of the PLL 130-1) applies a low-voltage bias 606 ($V_{pbias}$ 606) to a gate of the p-MOSFET 602 to enable flow of a first current through the up current source 412.

The down current source 414 (also of FIG. 4-1) may be implemented using a second transistor, such as an n-MOSFET 608 ($M_{DCS}$ 608). As part of, or associated with, the down current source 414, the charge pump 132 can include a second resistor 610 (resistor 610 or $R_2$ 610), which also has a first terminal and a second terminal. The first terminal of the second resistor 610 is coupled to a source of the n-MOSFET 608, and the second terminal of the second resistor 610 is coupled to a ground (GND). The charge pump 132 (or other circuitry of the PLL 130-1) applies a high voltage bias 612 ($V_{nbias}$ 612) to a gate of the n-MOSFET 608 to enable flow of a second current through the down current source 414.

In contrast with the up current source 412 (UCS 412 of FIG. 4-1), the down current source 414 (DCS 414 of FIGS. 4-1) is implemented as a substantially "constantly" leaking current source in FIGS. 6-1 and 6-2. Specifically, the second terminal of the first switch 422 is coupled to a drain of the n-MOSFET 608. Regarding the up and down current sources, substantially "constantly" leaking refers to during normal operation of the PLL 130-1, such as while establishing or maintaining a lock. Thus, the down current source 414 of FIG. 4-1 may not be constantly leaking, for example, in a special mode or when the PLL 130-1 is unpowered. The down current source 414 of FIG. 4-1 can be implemented as a constantly leaking current source regardless of a state (e.g., opened or closed) of the first switch 422, in part because the output of the charge pump 132 is coupled to the control signal $V_{control}$ 326. Here, the drain of the n-MOSFET 608 is not floating to ensure that a drain-to-source voltage ($V_{DS}$) of the n-MOSFET 608 is greater than zero ($V_{DS}>0$).

The constantly leaking current source (DCS 414 of FIG. 4-1) mitigates some of the charge-sharing issues that can exist between the first node 436 and the second node 434. In FIGS. 6-1, 6-2, and 7, the charge-sharing issue can occur between an intrinsic parasitic capacitance 620 ($C_P$ 620) of the first current source of the charge pump 132 and a capacitance of the filter 136. The intrinsic capacitances are depicted with capacitors and connections having a small-dashed line appearance. In FIGS. 6-1 to 7, the intrinsic parasitic capacitance 620 of the p-MOSFET 602 is depicted as being coupled between the supply voltage ($V_{DD}$) and the first node 436 or the second node 434. A manufacturer may not intentionally architect the intrinsic capacitances. The manufacturer, however, uses the buffer 134 (e.g., the buffer 134-1 of FIG. 6-1) to mitigate charge-sharing issues that arise, in part, because of the intrinsic capacitances.

The capacitance of the filter 136 is present due to one or more capacitors, such as the at least one filter capacitor 306 of FIG. 3, and/or an intrinsic capacitance (not illustrated in FIG. 6-1) of the constantly leaking current source. The filter 136 may include alternative or additional capacitor(s) and one or more resistors. For example, the filter 136 can include a parallel capacitor 624 (capacitor 624 or $C_P$ 624) coupled between a wire carrying or having the control signal $V_{control}$ 326 and the ground. The filter 136 can also include a third resistor 626 (resistor 626 or $R_Z$ 626) that is coupled in series with another capacitor 628 (capacitor 628 or $C_Z$ 628). The series connection of the third resistor 626 and the other capacitor 628 is coupled between the second node 434 having the control signal $V_{control}$ 326 and ground. The filter 136 filters part of the noise of the control signal $V_{control}$ 326 to produce the tracking signal $V_{control\ tracking}$ 328. The tracking signal $V_{control\ tracking}$ 328 may be used for the voltage-tracking function by coupling $V_{control\ tracking}$ 328 to the example buffer 134-1.

In the buffer 134-1, the first voltage buffer 502-1 may be implemented using at least a first transistor 630-1, such as an n-MOSFET (n-MOSFET 630-1 or $T_1$ 630-1) having multiple terminals. These FET terminals can include one or more channel terminals and a gate terminal. The channel terminal or channel terminals can include a drain terminal and a source terminal. For brevity, a drain terminal, a source terminal, and a gate terminal may respectively be referred to herein as a drain, a source, and a gate. For ease of description and clarity, the drawings and the accompanying descriptions do not explicitly illustrate or discuss a body, a bulk, a substrate, a well, and so forth of the various n-MOSFETs and p-MOSFETs. Nonetheless, a device can couple or bias the body, the bulk, the substrate, the well, and so forth of the various n-MOSFETs and p-MOSFETs to appropriate signals or appropriate voltage biases. In FIG. 6-1, the drain of the n-MOSFET 630 is coupled to a first node 632-1 (node 632-1 or $q_1$ 632-1) of the buffer 134-1, and the gate of the n-MOSFET 630-1 is coupled to a node providing the tracking signal $V_{control\ tracking}$ 328 from the filter 136. The source of the n-MOSFET 630-1 is coupled to a second node 634-1 (node 634-1 or $q_2$ 634-1) of the buffer 134-1 and to the current mirror 506.

As is illustrated in FIG. 6-1, the second voltage buffer 502-2 may be implemented using at least a second transistor 636-1, such as a p-MOSFET (p-MOSFET 636-1 or $T_2$ 636-1) having a drain, a source, and a gate. The source of the p-MOSFET 636-1 is coupled to the first node 632-1, and the gate of the p-MOSFET 636-1 is coupled to the second node 634-1 and to the source of the n-MOSFET 630-1. The drain of the p-MOSFET 636-1 is coupled to a third node 644-1 (node 644-1 or $q_3$ 644-1) and to the current mirror 506. As connected, if using CMOS-based technology, the first transistor 630-1 ($T_1$ 630-1) can implement a source-follower amplifier for the first voltage buffer 502-1. Alternatively, when using BJT-based technology, the first transistor 630-1 ($T_1$ 630-1) can implement an emitter-follower amplifier for the first voltage buffer 502-1 (although not illustrated as such). Similarly, the second transistor 636-1 ($T_2$ 636-1) can implement a source-follower amplifier for the second voltage buffer 502-2. Alternatively, when using BJT-based technology, the second transistor 636-1 ($T_2$ 636-1) can implement an emitter follower for the second voltage buffer 502-2 (although not illustrated as such).

The first voltage buffer 502-1 can also include a third transistor 640-1 of the buffer 134-1. When using CMOS-based technology, the third transistor 640-1 can be an n-MOSFET (n-MOSFET 640-1 or $T_3$ 640-1) having a source, a drain, and a gate. When using BJT-based technology, the third transistor 640-1 can be an NPN BJT (not illustrated as such) having an emitter, a collector, and a base. Similarly, the second voltage buffer 502-2 can include a fourth transistor 638-1 of the buffer 134-1. When using CMOS-based technology, the fourth transistor 638-1 can be an n-MOSFET (n-MOSFET 638-1 or $T_4$ 638-1) having a source, a drain, and a gate. When using BJT-based technology, the fourth transistor 638-1 can be an NPN BJT (not illustrated as such) having an emitter, a collector, and a base.

As is illustrated in FIG. 6-1, the current mirror 506 may be implemented using the fourth transistor 638-1. The drain of the n-MOSFET 638-1 is coupled to the drain of the p-MOSFET 636-1. The source of the n-MOSFET 638-1 is coupled to a ground. The gate of the n-MOSFET 638-1 is coupled to the drain of n-MOSFET 638-1 and to the third node 644-1. With the gate and drain terminals of the fourth transistor 638-1 connected to each other, the fourth transistor 638-1 is connected in a diode configuration. The current mirror 506 may also be implemented using the third transistor 640-1. The drain of the n-MOSFET 640-1 is coupled to the source of the n-MOSFET 630-1 and to the second node 634-1. The source of the n-MOSFET 640-1 is coupled to the ground. The gate of the n-MOSFET 640-1 is coupled to the gate of the n-MOSFET 638-1 and to the third node 644-1. Accordingly, as is illustrated in FIG. 6-1, the n-MOSFET 638-1 and the n-MOSFET 640-1 may operate and/or may constitute a current mirror circuit (e.g., the distributed current mirror 506).

As such, the n-MOSFET 638-1 operates in a saturation or active mode (or region) in which a drain-to-source voltage ($V_{DS}$) is approximately equal to or greater than a gate-to-source voltage ($V_{GS}$) minus a threshold voltage ($V_{THN}$) of the n-MOSFET 638 ($V_{DS} \geq V_{GS} - V_{THN}$). Similarly, the n-MOSFET 640-1 also operates in the saturation or active mode. As a result, the n-MOSFET 638-1 and the n-MOSFET 640-1 can enable a same amount of current to flow through the n-MOSFET 630-1 and the p-MOSFET 636-1, assuming no current scaling is employed by the current mirror 506 and that current flow through the resistor 642-1 is relatively negligible. Accordingly, the current mirror 506 can facilitate a first portion of a current flowing through the second switch 440 to flow through the first voltage buffer 502-1 and a second portion of that current to flow through the second voltage buffer 502-2. The current mirror 506 can also facilitate the circuitry of the buffer 134-1 to be self-biased. This self-biasing can obviate routing power, a bias voltage, or a separate current source to the buffer 134-1 to simplify circuitry or save power.

To reduce an amount of current flowing through the n-MOSFET 640-1 or to ensure the p-MOSFET 636-1 is biased in an active range, the buffer 134-1 can utilize a bias circuit 504-1 of FIG. 6-1. In one aspect, the bias circuit 504-1 may include a variable resistor 642-1 (resistor 642-1 or $R_B$ 642-1) to sink some amount or magnitude of current to ground (GND). The variable resistor 642-1 includes a first terminal and a second terminal. The first terminal of the variable resistor 642-1 is coupled to the second node 634-1, and the second terminal of the variable resistor 642-1 is coupled to ground. In an example aspect, the variable resistor 642-1 may be implemented using an array of parallel resistors with respective switches that enable the buffer 134-1, or control circuitry of the PLL 130-1, to selectively establish a resistance value of the variable resistor 642-1. The first terminal of the variable resistor 642-1 is coupled to the gate of the p-MOSFET 636-1. Consequently, a targeted resistance of the variable resistor 642-1 can be established to be low enough to turn on the p-MOSFET 636-1. If, for instance, the resistance of the variable resistor 642-1 is high enough to turn off the p-MOSFET 636-1, the buffer 134-1 can selectively close one or more switches to target an appropriate resistance value of the variable resistor 642-1.

With reference to FIGS. 4-1, 6-1, and 6-2, the first switch 422 and the second switch 440 are operated to have complementary states. During a first operational phase ($\varphi_1$), the locked loop 130 (e.g., the PLL 130-1) opens the first switch 422, closes the second switch 440, and charges the intrinsic parasitic capacitance 620. During a second operational phase ($\varphi_2$), the locked loop 130 (e.g., the PLL 130-1) closes the first switch 422, opens the second switch 440, and discharges the intrinsic parasitic capacitance 620. This is further described below using Equations 1 to 3 and with reference to FIGS. 7, 8-1, and 8-2.

There is a relatively direct relationship between the bandwidth of the locked loop 130 and the output impedance $R_{OUT}$ of the charge pump 132. One way to calculate, simulate, or measure the output impedance $R_{OUT}$ of the charge pump 132 is to determine a "looking-in impedance," as is indicated in FIGS. 6-1 to 7. A higher output impedance $R_{OUT}$ of the charge pump 132 can increase the bandwidth of the locked loop 130. Consequently, with a higher output impedance for the charge pump 132, the locked loop 130 may accommodate a VCO 308 that operates with increased noise (e.g., greater in-band noise) but that consumes less power. Next, FIG. 6-2 illustrates an alternate buffer design (e.g., with a buffer 134-2) that also mitigates the charge-sharing issue that is, in part, driven by the intrinsic parasitic capacitance 620.

FIG. 6-2 illustrates an example schematic diagram 600-2 of the charge pump 132 coupled to an example implementation of a buffer 134-2, and an example implementation of, and an example coupling to, a filter 136. FIG. 6-2 is described in the context of the FIGS. 1, 2, 3, 4-1, 6-1, the locked loop 130, the phase-frequency detector 304 of FIG. 3, and the phase-frequency detector 304-1 of FIG. 4-1. FIG. 6-2 differs from the example operations of FIG. 4-2. Instead, the example operations of FIG. 4-2 are described with reference to FIGS. 6-3 and 6-4. Note that reference numerals of certain circuit elements in the buffer 134-1 of FIG. 6-1 end with "–1," reference numerals of corresponding circuit elements in the buffer 134-2 of FIG. 6-2 end with "–2," reference numerals of corresponding circuit elements in the buffer 134-3 of FIG. 6-3 end with "–3," and reference numerals of corresponding circuit elements in the buffer 134-4 of FIG. 6-4 end with "–4."

The charge pump 132 and the filter 136 of FIG. 6-2 may be the same as the charge pump 132 and the filter 136 of FIG. 6-1, where the filter 136 is coupled at the second node 434. The buffer 134-2 of FIG. 6-2, however, differs from the buffer 134-1 of FIG. 6-1. Specifically, as is illustrated in FIG. 6-2, a drain of an n-MOSFET 630-2 is coupled to a supply voltage ($V_{DD}$), instead of a first node 632-2. Also, in contrast with FIG. 6-1, in FIG. 6-2 instead of implementing a current mirror 506, a gate of an n-MOSFET 638-2 may be uncoupled from a gate of an n-MOSFET 640-2. In this alternative implementation, the n-MOSFET 638-2 can still operate as a diode, and the n-MOSFET 640-2 can be tied to a high voltage bias to turn it on. To produce the high voltage bias, the buffer 134-2 uses a bias circuit 504-2.

In an example implementation, the bias circuit 504-2 may include a current source 650-2 and a diode-connected transistor 652-2, such as an n-MOSFET 652-2 ($M_{diode}$ 652-2). In detail, the current source 650-2 is coupled between a supply voltage ($V_{DD}$) and a drain of the n-MOSFET 652-2, whereas a source of the n-MOSFET 652-2 is coupled to ground (GND). A gate of the n-MOSFET 652-2 is coupled to the drain of the n-MOSFET 652-2, which enables the n-MOSFET 652-2 to operate like a diode. The gate of the n-MOSFET 652-2 is also coupled to the gate of the n-MOSFET 640-2, enabling the high voltage bias. In one aspect, in FIG. 6-2, the n-MOSFET 640-2 of the first voltage buffer 502-1 and the n-MOSFET 652-2 of the bias circuit 504-2 operate as a current mirror. Unlike FIG. 6-1, however, in FIG. 6-2 the n-MOSFET 638-2 and the n-MOSFET 640-2 do not operate as a current mirror 506. By not utilizing a joint current mirror 506, the first voltage buffer 502-1 may draw more current than the second voltage buffer 502-2, or vice versa.

FIGS. 4-1, 6-1, and 6-2 illustrate how the charge pump 132, the buffer 134 (e.g., buffer 134-1 or buffer 134-2), and the filter 136 can utilize a constantly leaking down current source (e.g., DCS 414 of FIG. 4-1) to mitigate some of the charge-sharing issues that can exist between the first node 436 and the second node 434. In contrast, FIGS. 4-2, 6-3, and 6-4 illustrate how the charge pump 132, the buffer 134 (e.g., a buffer 134-3 or a buffer 134-4), and the filter 136 may utilize a constantly leaking up current source (e.g., UCS 412 of FIG. 4-2) to mitigate some of the charge-sharing issues that can exist between the first node 436 and the second node 434, as is further described below, starting with FIG. 6-3.

FIG. 6-3 illustrates an example schematic diagram 600-3 of the charge pump 132 coupled to an example implementation of a buffer 134-3 and an example implementation of, and an example coupling to, a filter 136. In contrast to FIGS. 4-1, 6-1, 6-2, and 7, the filter 136 is coupled nearer the up current source 412, but the filter 136 is still coupled to the second node 434 and nearer a second current source. FIG. 6-3 is described in the context of the FIGS. 1, 2, 3, 4-2, the locked loop 130, the phase-frequency detector 304 of FIG. 3, and the phase-frequency detector 304-2 of FIG. 4-2. FIG. 6-3 differs, therefore, from the example operations of FIG. 4-1. Instead, the example operations of FIG. 4-1 are described above with reference to FIGS. 6-1 and 6-2.

In contrast with FIGS. 4-1, 6-1, 6-2, and 7, in FIGS. 4-2, 6-3, and 6-4, the up current source 412 is implemented as a "constantly" leaking current source instead of the down current source 414. Therefore, the second switch 440 is coupled between the first node 436 and the buffer 134-3 nearer a switchable first current source. In FIGS. 6-3 and 6-4, the charge-sharing issue can occur between an intrinsic parasitic capacitance 622 (CN 622) of the first current source (e.g., the DCS 414 in this implementation) of the charge pump 132 and the capacitance of the filter 136. Consequently, the buffer 134-3 of FIG. 6-3 and the buffer 134-4 of FIG. 6-4 mitigate some of the charge-sharing issues that arise from the intrinsic parasitic capacitance 622.

In FIGS. 6-3 and 6-4, transistors $T_1$ (630-3, 630-4), $T_2$ (636-3, 636-4), $T_3$ (640-3, 640-4), $T_4$ (638-3, 638-4), and $M_{diode}$ 652-4 are complementary types compared to corresponding transistors of the buffer 134-1 of FIG. 6-1 and the buffer 134-2 of FIG. 6-2. For example, instead of using n-MOSFETs (or NPN BJTs), the buffers 134-3 and 134-4 use p-MOSFETs (or PNP BJTs). Similarly, instead of using p-MOSFETs (or PNP BJTs), the buffers 134-3 and 134-4 use n-MOSFETs (or NPN BJTs). As such, in FIGS. 6-3 and 6-4, transistor $T_1$ (630-3, 630-4) is a p-MOSFET having a source, a drain, and a gate; transistor $T_2$ (636-3, 636-4) is an n-MOSFET (636-3, 636-4) having a source, a drain, and a gate; transistor $T_3$ (640-3, 640-4) is a p-MOSFET (640-3, 640-4) having a source, a drain, and a gate; transistor $T_4$ (638-3, 638-4) is a p-MOSFET (638-3, 638-4) having a source, a drain, and a gate; and the diode-connected transistor $M_{diode}$ 652-4 is a p-MOSFET 652-4 having a source, a drain, and a gate.

The transistors $T_1$ 630-3 (p-MOSFET 630-3), $T_2$ 636-3 (n-MOSFET 636-3), $T_3$ 640-3 (p-MOSFET 640-3), and $T_4$ 638-3 (p-MOSFET 638-3) are coupled together in the buffer 134-3, as is illustrated in FIG. 6-3. Further, the p-MOSFET 638-3 is diode-connected, and the gate of p-MOSFET 638-3 is coupled to the gate of p-MOSFET 640-3 to enable operation as a current mirror 506 (not indicated in FIG. 6-3 for clarity). The current mirror 506 enables the first voltage buffer 502-1 to draw a current of a same magnitude as the second voltage buffer 502-2 (not indicated in FIG. 6-3 for clarity). In contrast to FIG. 6-1, however, the buffer 134-3 of FIG. 6-3 is coupled between a first node 632-3 and a supply voltage ($V_{DD}$) (instead of ground). Consequently, a bias circuit 504-3 may be implemented with a resistor 642-3 coupled between a second node 634-3 and a supply voltage ($V_{DD}$) (instead of ground). Similar to FIG. 6-1, the resistor 642-3 may be a variable resistor. Next, FIG. 6-4 illustrates an alternate buffer (e.g., buffer 134-4) design that operates without utilizing a current mirror 506 distributed across first and second voltage buffers 502-1 and 502-2.

FIG. 6-4 illustrates an example schematic diagram 600-4 of the charge pump 132 coupled to an example implementation of a buffer 134-4 and an example implementation of, and an example coupling to, a filter 136. Similar to FIG. 6-3, the filter 136 is coupled closer to the leaking second current source, which corresponds to the UCS 412. FIG. 6-4 is described in the context of the FIGS. 1, 2, 3, 4-2, 6-3, the locked loop 130, the phase-frequency detector 304 of FIG. 3, and the phase-frequency detector 304-2 of FIG. 4-2. FIG. 6-4 differs, therefore, from the example operations of FIG. 4-1, which are instead described above with reference to FIGS. 6-1 and 6-2.

FIG. 6-4 illustrates transistors $T_1$ 630-4 (p-MOSFET 630-4), $T_2$ 636-4 (n-MOSFET 363-4), $T_3$ 640-4 (p-MOSFET 640-4), and $T_4$ 638-4 (p-MOSFET 638-4) being coupled together in the buffer 134-4, where the p-MOSFET 638-4 is diode-connected. The buffer 134-4 of FIG. 6-3, however, differs from the buffer 134-3 of FIG. 6-3. Specifically, as is illustrated in FIG. 6-4, the drain of the p-MOSFET 630-4 is coupled to ground (GND) instead of a first node 632-4. Also, in contrast with FIG. 6-3, instead of implementing a joint current mirror 506, the gate of p-MOSFET 638-4 is uncoupled from the gate of p-MOSFET 640-4.

In FIG. 6-4, the p-MOSFET 638-4 can operate as a diode, and the p-MOSFET 640-4 can be tied to a low-voltage bias to turn it on. To produce the low-voltage bias, the buffer 134-4 uses a bias circuit 504-4. In an example implementation, the bias circuit 504-4 may include a current source 650-4 and a diode-connected transistor 652-4, such as a p-MOSFET 652-4 ($M_{diode}$ 652-4). In detail, the current source 650-4 is coupled between a ground (GND) and the drain of the p-MOSFET 652-4, whereas the source of the p-MOSFET 652-4 is coupled to a supply voltage ($V_{DD}$). The gate of the p-MOSFET 652-4 is coupled to the drain of the p-MOSFET 652-4, which enables the p-MOSFET 652-4 to operate like a diode. The gate of the p-MOSFET 652-4 is also coupled to the gate of the p-MOSFET 640-4, enabling the low voltage bias. In one aspect, in FIG. 6-4, the p-MOSFET 640-4 of the first voltage buffer 502-1 and the p-MOSFET 652-4 of the bias circuit 504-4 operate as a current mirror. Unlike FIG. 6-3, however, in FIG. 6-4 the p-MOSFET 638-4 and the p-MOSFET 640-4 do not operate as a current mirror 506. By not utilizing a joint current mirror 506, the first voltage buffer 502-1 may draw more current than the second voltage buffer 502-2, or vice versa.

FIG. 7 illustrates an example schematic diagram 700 of the charge pump 132, which is coupled to a buffer 134-1, the filter 136, and a diode 702. The diode 702 may be implemented with a diode-connected transistor 702-1, such as an n-MOSFET 702-1 ($M_{diode}$ 702-1). Specifically, a drain of the n-MOSFET 702-1 is coupled to the first node 632-1 at a second terminal of the second switch 440. A gate of the n-MOSFET 702-1 is coupled to the drain of the n-MOSFET 702-1, which enables the n-MOSFET 702-1 to operate like a diode 702.

The buffer 134-1 of FIG. 7 operates and is coupled similarly to the buffer 134-1 of FIG. 6-1. By utilizing the diode 702 and two additional switches—for example, an n-MOSFET 714 ($M_{sb}$ 714) and an n-MOSFET 716 ($M_{sd}$ 716)—the circuitry of FIG. 7 may operate in a first configuration 710 or a second configuration 712. In FIG. 7, the first configuration 710 and the second configuration 712 are described in the context of the diode 702 and the buffer 134-1 of FIG. 6-1. Alternative configurations, however, may be implemented using other buffers (e.g., the buffers 134-2, 134-3, and 134-4 of FIGS. 6-2, 6-3, and 6-4, respectively). To operate selectively in two configurations, the two switches can selectively enable the diode 702 or the buffer 134-1. A drain of the n-MOSFET 714 is coupled to the source of the n-MOSFET 638-1 and the source of the n-MOSFET 640-1. A source of the n-MOSFET 714 is coupled to a ground. A drain of the n-MOSFET 716 is coupled to a source of the n-MOSFET 702-1 of the diode 702, and a source of the n-MOSFET 716 is coupled to the ground. The n-MOSFETs 714 and 716 are operated to have complementary states to enable the charge pump 132 to operate in the first configuration 710 or in the second configuration 712.

Each of the first and second configurations 710 and 712 enables the charge pump 132 to operate in two phases. The two phases of the second configuration 712 may be referred to as a first phase and a second phase. For clarity, the two phases of the first configuration 710 may be referred to as a third phase and a fourth phase, as is further described below (e.g., for FIGS. 8-1 and 8-2). Such phases may, however, be referred to using different numeric terms herein.

In the first configuration 710, the charge pump 132 utilizes the buffer 134 by turning on the n-MOSFET 714 and turning off the n-MOSFET 716. To turn on the n-MOSFET 714, a gate of the n-MOSFET 714 is set to a high bias voltage (e.g., $V_{bias1}$ 714-1 is set to "high," "one (1)," or $V_{DD}$). To turn off the n-MOSFET 716, a gate of the n-MOSFET 716 is set to a low bias voltage (e.g., $V_{bias2}$ 716-1 is set to "low," "zero (0)," or ground). In the second configuration 712, the charge pump 132 utilizes the diode 702 instead of the buffer 134-1 by turning on the n-MOSFET 716 and turning off the n-MOSFET 714. To turn on the n-MOSFET 716, the gate of the n-MOSFET 716 is set to a high bias voltage. To turn off the n-MOSFET 714, the gate of the n-MOSFET 714 is set to a low bias voltage.

To reduce the power consumed by a VCO (e.g., the VCO 308 of FIG. 3) and to accommodate an associated noise-increase of the VCO, the locked loop 130 (e.g., the PLL 130-1) may utilize the first configuration 710. Alternatively, if a locked loop 130 utilizes a VCO with more power consumption but with lower noise (e.g., less in-band noise), the locked loop 130 may utilize the second configuration 712. In the first configuration 710, an output impedance $R_{OUT}$ (illustrated as the "looking-in impedance" in FIGS. 6-1 to 7) of the charge pump 132 is appreciably higher (e.g., ten times to fifteen times higher) than in the second configuration 712. The increased output impedance $R_{OUT}$ of the charge pump 132 enables the locked loop 130 to operate with a wider bandwidth.

The wider bandwidth of the locked loop 130 can accommodate or utilize a VCO (e.g., VCO 308) that is operating with a higher noise level (e.g., more in-band noise). The higher-noise VCO may consume less power. Consequently, the locked loop 130, which includes the VCO, also consumes less power. If a lower-noise VCO is employed or is currently active, the locked loop 130 can use the diode 702 of the second configuration 712. The diode 702 can be used because the diode 702 may produce less noise than the buffer 134-1, and the loop bandwidth may be a relatively lower concern with the lower-noise VCO case.

Equations 1 to 3 illustrate a simplified calculation of the output impedance $R_{OUT}$ of the charge pump 132 of FIG. 7:

$$i_{C_P 620} = (C_P 620) \cdot \frac{(V_{control} 326) - (V_{q_1} 632-1)}{T}; \quad \text{Equation 1}$$

$$R_{OUT} = \frac{(V_{control} 326) - (V_{q_1} 632-1)}{i_{C_P 620}}; \text{ and/or} \quad \text{Equation 2}$$

$$R_{OUT} = \frac{T}{C_P 620}, \quad \text{Equation 3}$$

where $i_{C_P 620}$ denotes a current flowing through the intrinsic parasitic capacitance 620, $C_P$ 620 denotes a capacitance value of the intrinsic parasitic capacitance 620, T denotes a reference clock duration period (e.g., during an operation of the locked loop 130 or during a simulation of the charge pump 132), V control 326 denotes a voltage value of the control signal 326, and $V_{q_1}$ 632-1 denotes a voltage value at the first node 632-1.

Equations 1 to 3 (e.g., Equation 2) illustrate that in the first configuration 710, the current flowing through the intrinsic parasitic capacitance 620 ($C_P$ 620) is appreciably lower than in the second configuration 712. The down current source 414 of FIG. 7 is implemented as a constantly leaking current source in the first and second configurations 710 and 712. In other implementations, however (e.g., like in FIGS. 4-2, 6-3, and 6-4), the up current 412 may be implemented as a constantly leaking current source in a first and a second configuration. In FIG. 7, both configurations (710 and 712) can mitigate some of the charge-sharing issues. The first configuration 710, however, can mitigate the charge-sharing issue more effectively, as is further described for FIGS. 8-1 and 8-2.

Figures 1, 8:
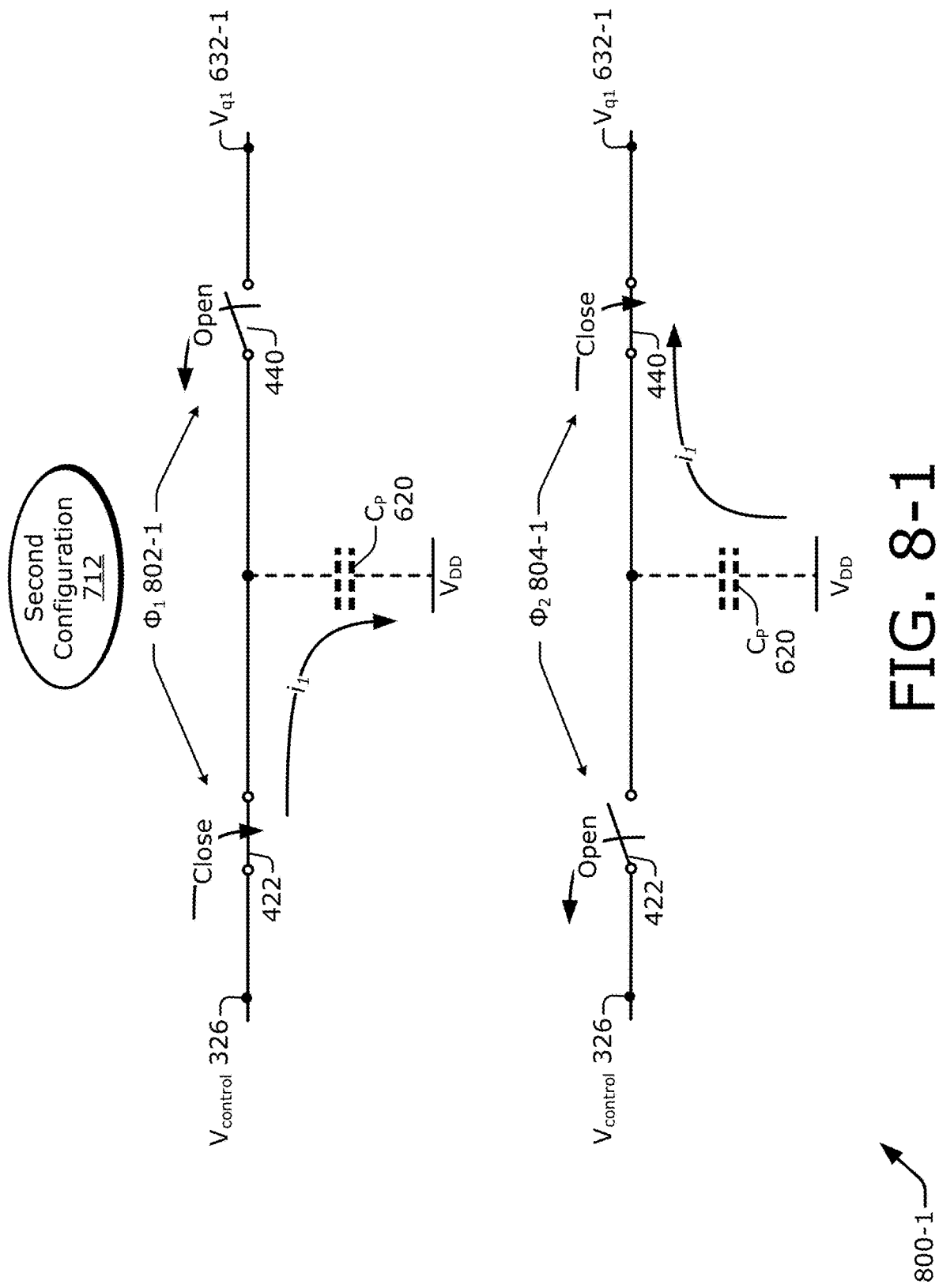
Figures 2, 8:
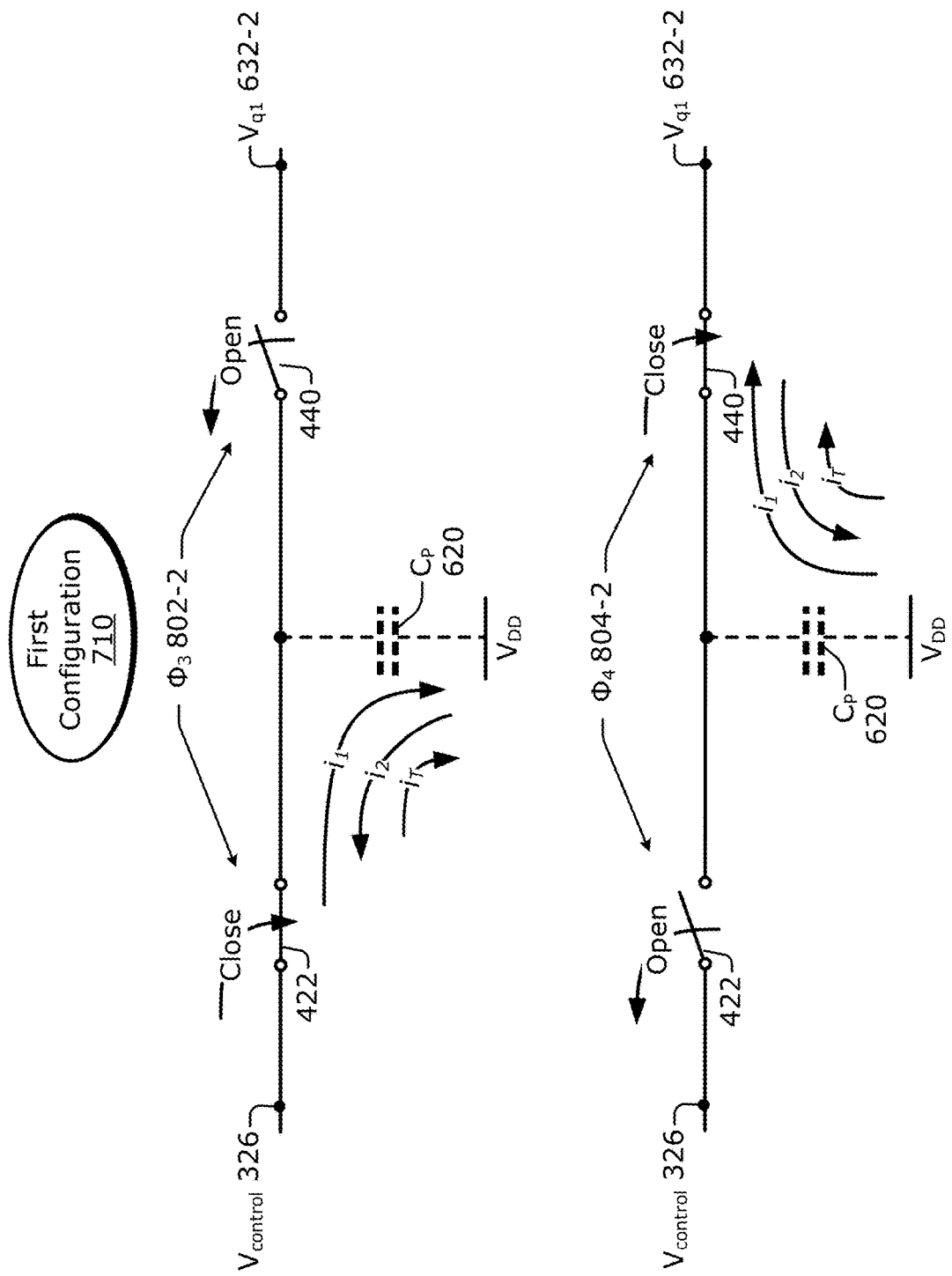

FIG. 8-1 illustrates an example environment 800-1 that qualitatively and visually illustrates a charge-sharing issue in the second configuration 712. For brevity and clarity, FIG. 8-1 is described in the context of FIG. 7 and the charge pump 132, which is coupled to the buffer 134-1, the filter 136, and the diode 702. Nonetheless, the charge-sharing issue may also be mitigated using other buffer designs (e.g., those of the buffers 134-2, 134-3, and 134-4). In the second configuration 712, however, the charge pump 132 utilizes the diode 702 instead of the buffer 134-1.

In the second configuration 712, during a first phase of operation $\phi_1$ 802-1 (first operational phase $\phi_1$ 802-1), the locked loop 130 (e.g., the PLL 130-1) closes the first switch 422, opens the second switch 440, and charges the intrinsic parasitic capacitance 620 ($C_P$ 620) of the up current source 412 of the charge pump 132. A current with a magnitude $i_1$ flows to the intrinsic parasitic capacitance 620 in the direction shown in FIG. 8-1. Specifically, during the first operational phase $\phi_1$ 802-1, the current with the magnitude $i_1$ flows from the control signal $V_{control}$ 326 (e.g., from the second node 434 at the filter 136) toward the supply voltage ($V_{DD}$) of the charge pump 132. Note that by opening the second switch 440, the first node $q_1$ 632-1 (e.g., the first node 632-1 during the second configuration 712) of FIG. 7 remains floating because, in the second configuration 712, the charge pump 132 does not utilize the voltage-tracking function.

Continuing in the second configuration 712, during a second phase of operation $\phi_2$ 804-1 (second operational phase $\phi_2$ 804-1), the locked loop 130 opens the first switch 422, closes the second switch 440, and discharges the intrinsic parasitic capacitance 620 of the charge pump 132. The current with the magnitude $i_1$ flows out of the intrinsic parasitic capacitance 620 in the direction shown in FIG. 8-1. Specifically, during the second operational phase $\phi_2$ 804-1, the current with the magnitude $i_1$ flows from the supply voltage $V_{DD}$ of the charge pump 132 to the first node $q_1$ 632-1 of FIG. 7. Referring to Equations 1 to 3, it is apparent that an increased current of the intrinsic parasitic capacitance 620 ($C_P$ 620) (e.g., $i_{C_P 620}$ or $i_1$) decreases the output impedance $R_{OUT}$ of the charge pump 132. A decreased output impedance $R_{OUT}$ (e.g., to ten (10) to fifteen (15) kiloohms (kΩ)) of the charge pump 132 can also decrease the bandwidth of the locked loop 130. To increase the bandwidth of the locked loop 130 (e.g., the PLL 130-1), the charge pump may utilize the buffer 134 (e.g., of FIGS. 6-1 and 7), as is further described for FIG. 8-2.

FIG. 8-2 illustrates an example environment 800-2 that qualitatively and visually illustrates a charge-sharing issue in the first configuration 710. FIG. 8-2 is described in the context of FIG. 8-1, FIG. 7, and the charge pump 132. The charge pump 132 is coupled to the buffer 134-1, the filter 136, and the diode 702. In the first configuration 710, the charge pump 132 utilizes the buffer 134 (e.g., the buffer 134-1 of FIG. 7) and the voltage-tracking function. Nonetheless, the charge-sharing issue may also be mitigated using other buffer designs (e.g., those of the buffers 134-2, 134-3, and 134-4). In the first configuration 710, the charge pump 132 does not utilize the diode 702.

In the first configuration 710, during a third phase of operation $\phi_3$ 802-2 (third operational phase $\phi_3$ 802-2), the locked loop 130 (e.g., the PLL 130-1) closes the first switch 422, opens the second switch 440, and charges the intrinsic parasitic capacitance 620 ($C_P$ 620) of the up current source 412 of the charge pump 132. Similar to the second configuration 712, in the first configuration 710, a current with a magnitude it flows to the intrinsic parasitic capacitance 620 in the direction shown in FIG. 8-2. Specifically, during the third operational phase $\phi_3$ 802-2, the current with the magnitude $i_1$ flows from the control signal $V_{control}$ 326 (e.g., from the second node 434 at the filter 136) toward the supply voltage ($V_{DD}$) of the charge pump 132. Unlike the second configuration 712, however, the first configuration 710 utilizes the voltage-tracking function.

The voltage-tracking function pushes a current with a magnitude $i_2$ in the opposite direction of $i_1$, as is illustrated in the third operational phase $\phi_3$ 802-2 of FIG. 8-2. Thus, the voltage-tracking function enables the charging of the intrinsic parasitic capacitance 620 of the charge pump 132 using a total current with a magnitude IT, where IT can be appreciably smaller than $i_1$. Therefore, as is indicated by Equations 1 to 3, the voltage-tracking function increases the output impedance $R_{OUT}$ of the charge pump 132 by decreasing the current flow. In the first configuration 710, the output impedance $R_{OUT}$ of the charge pump 132 is appreciably higher (e.g., ten times or fifteen times higher) than in the second configuration 712. The increased output impedance $R_{OUT}$ of the charge pump 132 enables the locked loop 130 to operate with a wider bandwidth.

Equivalently, continuing with the first configuration 710, during a fourth phase of operation $\phi_4$ 804-2 (fourth operational phase $\phi_4$ 804-2), the locked loop 130 opens the first switch 422, closes the second switch 440, and discharges the intrinsic parasitic capacitance 620 of the charge pump 132. The current with the magnitude $i_1$ flows out of the intrinsic parasitic capacitance 620 in the direction shown in FIG. 8-2. Specifically, during the fourth operational phase $\phi_4$ 804-2, the current with the magnitude it flows from the supply voltage $V_{DD}$ of the charge pump 132 to the first node $q_1$ 632-2 (e.g., the first node 632 during the first configuration 710) of FIG. 7. Unlike the second configuration 712, however, the first configuration 710 utilizes the voltage-tracking function. The voltage-tracking function pushes a current with a magnitude $i_2$ in the opposite direction of $i_1$, as is illustrated in the fourth operational phase $\phi_4$ 804-2 of FIG. 8-2.

Thus, the voltage-tracking function enables the charging of the intrinsic parasitic capacitance 620 of the charge pump 132 using a total current with a magnitude IT, where IT is appreciably smaller than $i_1$. Therefore, as is indicated by Equations 1 to 3, the voltage-tracking function increases the output impedance $R_{OUT}$ of the charge pump 132. In the first configuration 710, the output impedance $R_{OUT}$ of the charge pump 132 can be appreciably higher (e.g., ten times or fifteen times higher) than in the second configuration 712. The increased output impedance $R_{OUT}$ of the charge pump 132 enables the locked loop 130 to operate with a wider bandwidth so that the locked loop 130 can lock the frequency more quickly.

Figure 9:
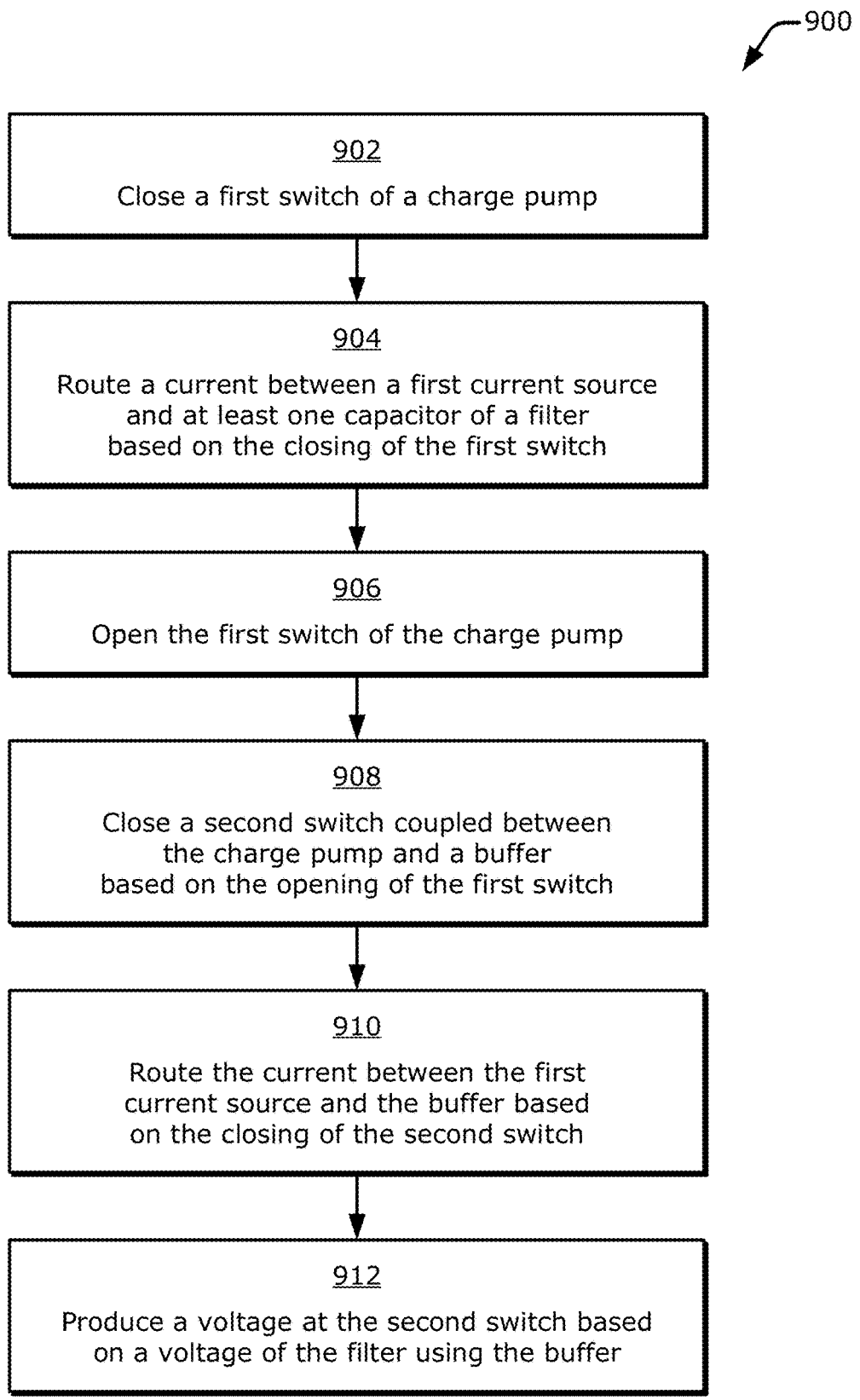
FIG. 9 is a flow diagram illustrating an example process for operating a charge pump with a voltage-tracking function to increase the bandwidth of a locked loop.

FIG. 9 is a flow diagram illustrating an example process 900 for operating a charge pump with a voltage-tracking function to increase the bandwidth of a locked loop. The process 900 is described in the form of a set of blocks 902-912 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900 or an alternative process. Operations represented by the illustrated blocks of the process 900 may be performed by a locked loop 130 or a portion thereof.

At block 902, a first switch of a charge pump is closed. For example, a locked loop 130 can close a first switch 422 of a charge pump 132. A phase-frequency detector 304, for instance, may close the first switch 422 with an up signal 416 in FIG. 4-1 (or a down signal 418 in FIG. 4-2). With complementary switch states, the closing of the first switch 422 may be linked to an opening of a second switch 440.

At block 904, a current is routed between a first current source and at least one capacitor of a filter based on the closing of the first switch. For example, the locked loop 130 can route a current from a first current source (e.g., an up current source 412) to at least one capacitor 306 of a filter 136 based on the closing of the first switch 422 in FIG. 4-1. The up current source 412 may provide the current to the filter capacitor 306 as a charge signal 338 via a second node 434. In some cases, a portion of the current provided by the up current source 412 may be routed toward a ground by another current source, such as a down current source 414. Alternatively, the locked loop 130 can route a current from at least one capacitor 306 of a filter 136 to a first current source (e.g., a down current source 414) based on the closing of the first switch 422 in FIG. 4-2.

At block 906, the first switch of the charge pump is opened. For example, the locked loop 130 can open the first switch 422 of the charge pump 132. To do so, the phase-frequency detector 304 may change a voltage on a phase-indication signal 334, which is coupled to a gate terminal of a transistor that is at least part of the first switch 422.

At block 908, a second switch coupled between the charge pump and a buffer is closed based on the opening of the first switch. For example, the locked loop 130 can close a second switch 440 coupled between the charge pump 132 and a buffer 134 based on the opening of the first switch 422. Here, the first and second switches 422 and 440 may be opened and closed to remain in complementary or inverted states. Thus, the phase-indication signal 334, or an inverted version thereof, may be applied to a gate terminal of a transistor that forms at least part of the second switch 440.

At block 910, the current is routed between the first current source and the buffer based on the closing of the second switch. For example, the locked loop 130 can route the current from the first current source (e.g., the UCS 412) to the buffer 134 based on the closing of the second switch 440, like with FIG. 4-1. Thus, the current from the up current source 412 may be used, or at least partially "reused," to operate circuitry in the buffer 134. This can be more power-efficient than providing a separate current for the buffer 134 and routing the current from the up current source 412 to ground. Alternatively, the locked loop 130 can route the current from the buffer 134 to the first current source (e.g., the DCS 414) based on the closing of the second switch 440, like with FIG. 4-2.

At block 912, a voltage is produced at the second switch based on a voltage of the filter using the buffer. For example, the locked loop 130 can produce a voltage at the second switch 440 based on a voltage of the filter 136 using the buffer 134. This voltage production may be accomplished at a first node 436 and may be performed by at least one voltage buffer 502 of the buffer 134 using at least one voltage-follower amplifier. By producing a voltage at the second switch 440 that is based on a voltage (e.g., a tracking voltage $V_{control\ tracking}$ 328) of the filter 136, the net current flows through a parasitic capacitance $C_p$ 620 of the up current source 412 of FIG. 4-1 (or of the down current source 414 of FIG. 4-2) may be reduced. The reduced current flows can increase the impedance of the charge pump 132 and thereby increase a bandwidth of the locked loop. With an increased bandwidth of the locked loop, noise produced by a voltage-controlled oscillator 308 or another locked loop component can be permitted to increase, which may enable a lower-power version of such a component to be employed.

In some implementations, the buffer 134 can route a first portion of the current from the second switch 440 through a first transistor (e.g., the n-MOSFET 630-1) of the buffer 134 to the ground. The buffer 134 can also route a second portion of the current from the second switch 440 through a second transistor (e.g., the p-MOSFET 636-1) of the buffer 134 to the ground. The voltage production at the second switch 440 can also entail controlling a magnitude of the first portion of the current relative to a magnitude of the second portion of the current using a current mirror 506. Further, by self-biasing two or more transistors of the buffer 134 using bias circuitry 504 of the buffer 134 or the current from the second switch 440, the operation of the buffer can be simplified or more power-efficient.

During operation to modulate the control signal $V_{control}$ 326 of the filter 136, the opening and closing of the first switch 422 or the second switch 440 can be controlled by the phase-frequency detector 304 using the phase-indication signal 334. To do so, the phase-frequency detector can determine to adjust charge (e.g., increase charge or decrease charge) on the at least one capacitor 306 (e.g., the parallel capacitor $C_p$ 624 or the filter capacitor $C_Z$ 628) of the filter 136. By determining whether to increase or decrease the charge, the phase-frequency detector 304 is determining whether to apply current with respect to the capacitor 306 by the first current source (e.g., by providing current from the UCS 412 for implementations of FIG. 4-1 and by drawing current to the DCS 414 for implementations of FIG. 4-2). If, however, a "leaking" second current source is employed in the charge pump 132 (e.g., a current source without a switch, including without a switch that is being opened, coupled between that current source and the filter 136, such as the DCS 414 of FIG. 4-1 and the UCS 412 of FIG. 4-2), another current can be routed from or to the at least one capacitor 306 of the filter 136 at least partially while the first switch 422 is in an open state and at least partially while the first switch 422 is in a closed state.

This section describes some aspects of example implementations and/or example configurations related to the apparatuses and processes presented above.

Example aspect 1: An apparatus comprising:
a locked loop comprising:
a charge pump comprising:
a first current source;
a second current source; and
a first switch coupled between the first current source and the second current source;
a filter coupled to the charge pump between the first switch and the second current source;
a second switch coupled to the charge pump between the first current source and the first switch; and
a buffer coupled between the filter and the second switch, the buffer comprising a voltage buffer.

Example aspect 2: The apparatus of example aspect 1, wherein:
the voltage buffer comprises a first voltage buffer; and
the buffer comprises a second voltage buffer.

Example aspect 3: The apparatus of example aspect 2 or 1, wherein:
at least one of the first voltage buffer or the second voltage buffer is coupled between the second switch and a power distribution node.

Example aspect 4: The apparatus of example aspect 3 or either one of the other preceding example aspects, wherein:
the buffer comprises a bias circuit coupled to the first voltage buffer, the bias circuit configured to establish a current in the second voltage buffer.

Example aspect 5: The apparatus of example aspect 3 or any one of the other preceding example aspects, wherein:
the second voltage buffer comprises a diode-connected transistor.

Example aspect 6: The apparatus of example aspect 5 or any one of the other preceding example aspects, wherein:
the buffer comprises a current mirror that is distributed across the first voltage buffer and the second voltage buffer; and
the current mirror comprises:
the diode-connected transistor of the second voltage buffer; and
a transistor of the first voltage buffer.

Example aspect 7: The apparatus of example aspect 1 or any one of the other preceding example aspects, wherein:
the voltage buffer comprises:
a first transistor comprising a channel terminal; and
a second transistor comprising a first channel terminal and a second channel terminal, the first channel terminal coupled to the channel terminal of the first transistor, and the second channel terminal coupled to a power distribution node; and
the buffer comprises a bias circuit coupled to a gate terminal of the second transistor.

Example aspect 8: The apparatus of example aspect 7 or any one of the other preceding example aspects, wherein:
the first transistor comprises a gate terminal, the gate terminal of the first transistor coupled to the filter.

Example aspect 9: The apparatus of example aspect 7 or any one of the other preceding example aspects, wherein:
the first transistor comprises at least one of:
a field-effect transistor (FET) configured as a source-follower amplifier; or
a bipolar junction transistor (BJT) configured as an emitter-follower.

Example aspect 10: The apparatus of example aspect 1 or any one of the other preceding example aspects, wherein:
the first current source is coupled between a supply voltage and the first switch; and
the second current source is coupled between the first switch and a ground.

Example aspect 11: The apparatus of example aspect 1 or any one of the other preceding example aspects, wherein:
the second current source is coupled between a supply voltage and the first switch; and
the first current source is coupled between the first switch and a ground.

Example aspect 12: The apparatus of example aspect 1 or any one of the other preceding example aspects, wherein:
the second current source comprises an unswitched current source of the charge pump relative to the filter.

Example aspect 13: The apparatus of example aspect 1 or any one of the other preceding example aspects, wherein:
the second current source is configured to leak current with respect to the filter while the locked loop is operational.

Example aspect 14: The apparatus of example aspect 13 or any one of the other preceding example aspects, wherein:
the second current source is configured to draw current from the filter substantially constantly while the locked loop is operational.

Example aspect 15: The apparatus of example aspect 1 or any one of the other preceding example aspects, wherein:
the filter comprises at least one capacitor coupled to a ground; and
the at least one capacitor is coupled to the voltage buffer.

Example aspect 16: The apparatus of example aspect 15 or any one of the other preceding example aspects, wherein the locked loop comprises:
a phase-frequency detector having an output coupled to the first switch of the charge pump; and
a voltage-controlled oscillator (VCO) having an input coupled to the at least one capacitor of the filter.

Example aspect 17: The apparatus of example aspect 1 or any one of the other preceding example aspects, wherein:
the locked loop is configured, responsive to the first switch being in an open state and the second switch being in a closed state, to route a current through the second switch between the first current source and the buffer; and
the buffer is configured to route at least a portion of the current through at least part of the voltage buffer.

Example aspect 18: The apparatus of example aspect 1 or any one of the other preceding example aspects, wherein:
the voltage buffer is configured to use at least one transistor as a source-follower amplifier to produce a voltage at the second switch that is based on another voltage at the filter.

Example aspect 19: The apparatus of example aspect 1 or any one of the other preceding example aspects, further comprising:
at least one antenna; and
a wireless interface device coupled to the at least one antenna, wherein:
the locked loop comprises a phase-locked loop (PLL); and
the wireless interface device comprises the PLL.

Example aspect 20: The apparatus of example aspect 19 or any one of the other preceding example aspects, further comprising:
a display screen; and
at least one processor operatively coupled to the display screen and at least a portion of the wireless interface device, the at least one processor configured to present one or more graphical images on the display screen based on one or more wireless signals received via the at least one antenna using the PLL of the wireless interface device.

Example aspect 21: An apparatus for tracking voltage in conjunction with a charge pump, the apparatus comprising:
first current source means for applying a first current with respect to at least one capacitor of a filter;
second current source means for applying a second current with respect to the at least one capacitor of the filter;
buffer means for tracking a voltage of the filter and coupling a version of the voltage to the first current source means; and
means for switching the first current source means from applying the first current to the at least one capacitor of the filter in a first operational phase to applying the first current to the buffer means in a second operational phase.

Example aspect 22: The apparatus of example aspect 21, wherein:
the second current source means for applying the second current comprises means for leaking the second current relative to the at least one capacitor of the filter during at least part of the first operational phase and during at least part of the second operational phase.

Example aspect 23: The apparatus of example aspect 22 or 21, wherein:
the means for leaking the second current relative to the at least one capacitor of the filter comprises means for withdrawing the second current from that at least one capacitor of the filter.

Example aspect 24: The apparatus of example aspect 21 or either one of example aspects 22 or 23, wherein the buffer means comprises:
first means for following the voltage of the filter;
second means for following the voltage of the filter; and
means for biasing the first means for following the voltage of the filter.

Example aspect 25: A method for tracking voltage in conjunction with a charge pump, the method comprising:
closing a first switch of a charge pump;
routing a current between a first current source and at least one capacitor of a filter based on the closing of the first switch;
opening the first switch of the charge pump;
closing a second switch coupled between the charge pump and a buffer based on the opening of the first switch;
routing the current between the first current source and the buffer based on the closing of the second switch; and
producing a voltage at the second switch based on a voltage of the filter using the buffer.

Example aspect 26: The method of example aspect 25, further comprising:
closing the first switch of the charge pump based on determining to adjust a charge on the at least one capacitor of the filter using the first current source;
opening the second switch based on the determining to adjust the charge on the at least one capacitor of the filter;
opening the first switch of the charge pump based on determining to change the charge on the at least one capacitor of the filter;
closing the second switch based on the determining to change the charge on the at least one capacitor of the filter; and
routing another current between a second current source and the at least one capacitor of the filter at least partially while the first switch is in an open state and at least partially while the first switch is in a closed state.

Example aspect 27: The method of example aspect 25 or 26, wherein the producing comprises:
routing a first portion of the current from the second switch through a first transistor of the buffer to a ground; and
routing a second portion of the current from the second switch through a second transistor of the buffer to the ground.

Example aspect 28: The method of example aspect 25 or either one of example aspects 26 or 27, wherein the producing comprises:
producing the voltage at the second switch based on the voltage of the filter using at least one voltage-follower amplifier of the buffer.

Example aspect 29: An apparatus comprising:
a locked loop comprising:
a charge pump;
a filter coupled to the charge pump;
a switch coupled to the charge pump; and
a buffer coupled between the filter and the switch, the buffer comprising:
a first transistor comprising a source terminal, a drain terminal, and a gate terminal, the drain terminal coupled to the switch and the gate terminal coupled to the filter;
a second transistor comprising a source terminal, a drain terminal, and a gate terminal; the source terminal coupled to the drain terminal of the first transistor, and the gate terminal coupled to the source terminal of the first transistor;
a third transistor comprising a source terminal and a drain terminal, the source terminal coupled to a ground, and the drain terminal coupled to the source terminal of the first transistor; and
a fourth transistor comprising a source terminal and a drain terminal, the source terminal coupled to the ground, and the drain terminal coupled to the drain terminal of the second transistor.

Example aspect 30: The apparatus of example aspect 29, wherein:
the first transistor comprises an n-type metal-oxide-semiconductor field-effect transistor (n-MOSFET);
the second transistor comprises a p-type metal-oxide-semiconductor field-effect transistor (p-MOSFET);
the fourth transistor comprises a gate terminal coupled to the drain terminal of the fourth transistor; and
the third transistor comprises a gate terminal coupled to the gate terminal of the fourth transistor.

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first node" or a "first current source" in one context may be identified as a "second node" or a "second current source," respectively, in another context. Similarly, a "first channel terminal of a first transistor" in one claim may be recited as a "second channel terminal of a third transistor" in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a locked loop comprising:
        a charge pump comprising:
            a first current source;
            a second current source; and
            a first switch coupled between the first current source and the second current source;
        a filter coupled to the charge pump between the first switch and the second current source;
        a second switch coupled to the charge pump between the first current source and the first switch; and
        a buffer coupled between the filter and the second switch, the buffer comprising a voltage buffer.

2. The apparatus of claim 1, wherein:
    the voltage buffer comprises a first voltage buffer; and
    the buffer comprises a second voltage buffer.

3. The apparatus of claim 2, wherein:
    at least one of the first voltage buffer or the second voltage buffer is coupled between the second switch and a power distribution node.

4. The apparatus of claim 3, wherein:
    the buffer comprises a bias circuit coupled to the first voltage buffer, the bias circuit configured to establish a current in the second voltage buffer.

5. The apparatus of claim 3, wherein:
    the second voltage buffer comprises a diode-connected transistor.

6. The apparatus of claim 5, wherein:
    the buffer comprises a current mirror that is distributed across the first voltage buffer and the second voltage buffer; and
    the current mirror comprises:
        the diode-connected transistor of the second voltage buffer; and
        a transistor of the first voltage buffer.

7. The apparatus of claim 1, wherein:
    the voltage buffer comprises:
        a first transistor comprising a channel terminal; and
        a second transistor comprising a first channel terminal and a second channel terminal, the first channel terminal coupled to the channel terminal of the first transistor, and the second channel terminal coupled to a power distribution node; and
    the buffer comprises a bias circuit coupled to a gate terminal of the second transistor.

8. The apparatus of claim 7, wherein:
    the first transistor comprises a gate terminal, the gate terminal of the first transistor coupled to the filter.

9. The apparatus of claim 7, wherein:
    the first transistor comprises at least one of:
        a field-effect transistor (FET) configured as a source-follower amplifier; or
        a bipolar junction transistor (BJT) configured as an emitter-follower.

10. The apparatus of claim 1, wherein:
    the first current source is coupled between a supply voltage and the first switch; and
    the second current source is coupled between the first switch and a ground.

11. The apparatus of claim 1, wherein:
    the second current source is coupled between a supply voltage and the first switch; and
    the first current source is coupled between the first switch and a ground.

12. The apparatus of claim 1, wherein:
    the second current source comprises an unswitched current source of the charge pump relative to the filter.

13. The apparatus of claim 1, wherein:
    the second current source is configured to leak current with respect to the filter while the locked loop is operational.

14. The apparatus of claim 13, wherein:
    the second current source is configured to draw current from the filter substantially constantly while the locked loop is operational.

15. The apparatus of claim 1, wherein:
    the filter comprises at least one capacitor coupled to a ground; and
    the at least one capacitor is coupled to the voltage buffer.

16. The apparatus of claim 15, wherein the locked loop comprises:
    a phase-frequency detector having an output coupled to the first switch of the charge pump; and
    a voltage-controlled oscillator (VCO) having an input coupled to the at least one capacitor of the filter.

17. The apparatus of claim 1, wherein:
    the locked loop is configured, responsive to the first switch being in an open state and the second switch being in a closed state, to route a current through the second switch between the first current source and the buffer; and
    the buffer is configured to route at least a portion of the current through at least part of the voltage buffer.

18. The apparatus of claim 1, wherein:
the voltage buffer is configured to use at least one transistor as a source-follower amplifier to produce a voltage at the second switch that is based on another voltage at the filter.

19. The apparatus of claim 1, further comprising:
at least one antenna; and
a wireless interface device coupled to the at least one antenna, wherein:
the locked loop comprises a phase-locked loop (PLL); and
the wireless interface device comprises the PLL.

20. The apparatus of claim 19, further comprising:
a display screen; and
at least one processor operatively coupled to the display screen and at least a portion of the wireless interface device, the at least one processor configured to present one or more graphical images on the display screen based on one or more wireless signals received via the at least one antenna using the PLL of the wireless interface device.

21. An apparatus for tracking voltage in conjunction with a charge pump, the apparatus comprising:
first current sourcing means for applying a first current with respect to at least one capacitor of a filter;
second current sourcing means for applying a second current with respect to the at least one capacitor of the filter;
first switchable means for switching coupled between the first current sourcing means and the second current sourcing means;
buffering means for tracking a voltage of the filter and coupling a version of the voltage to the charge pump; and
second switchable means for switching the first current sourcing means from applying the first current to the at least one capacitor of the filter in a first operational phase to applying the first current to the buffering means in a second operational phase, the second switchable means coupled to the charge pump between the first current sourcing means and the first switchable means, the buffering means coupled between the second switchable means and the filter.

22. The apparatus of claim 21, wherein:
the second current sourcing means for applying the second current comprises means for leaking the second current relative to the at least one capacitor of the filter during at least part of the first operational phase and during at least part of the second operational phase.

23. The apparatus of claim 22, wherein:
the means for leaking the second current relative to the at least one capacitor of the filter comprises means for withdrawing the second current from that at least one capacitor of the filter.

24. The apparatus of claim 21, wherein the buffering means comprises:
first means for following the voltage of the filter;
second means for following the voltage of the filter; and
means for biasing the first means for following the voltage of the filter.

25. A method for tracking voltage in conjunction with a charge pump, the method comprising:
closing a first switch of a charge pump;
routing a current between a first current source and at least one capacitor of a filter based on the closing of the first switch;
opening the first switch of the charge pump;
closing a second switch coupled between the charge pump and a buffer based on the opening of the first switch, the second switch coupled to the charge pump between the first current source and the first switch;
routing the current between the first current source and the buffer based on the closing of the second switch; and
producing a voltage at the second switch based on a voltage of the filter using the buffer.

26. The method of claim 25, further comprising:
closing the first switch of the charge pump based on determining to adjust a charge on the at least one capacitor of the filter using the first current source;
opening the second switch based on the determining to adjust the charge on the at least one capacitor of the filter;
opening the first switch of the charge pump based on determining to change the charge on the at least one capacitor of the filter;
closing the second switch based on the determining to change the charge on the at least one capacitor of the filter; and
routing another current between a second current source and the at least one capacitor of the filter at least partially while the first switch is in an open state and at least partially while the first switch is in a closed state.

27. The method of claim 25, wherein the producing comprises:
routing a first portion of the current from the second switch through a first transistor of the buffer to a ground; and
routing a second portion of the current from the second switch through a second transistor of the buffer to the ground.

28. The method of claim 25, wherein the producing comprises:
producing the voltage at the second switch based on the voltage of the filter using at least one voltage-follower amplifier of the buffer.

29. An apparatus comprising:
a locked loop comprising:
a charge pump;
a filter coupled to the charge pump;
a switch coupled to the charge pump; and
a buffer coupled between the filter and the switch, the buffer comprising:
a first transistor comprising a source terminal, a drain terminal, and a gate terminal, the drain terminal coupled to the switch and the gate terminal coupled to the filter;
a second transistor comprising a source terminal, a drain terminal, and a gate terminal; the source terminal coupled to the drain terminal of the first transistor, and the gate terminal coupled to the source terminal of the first transistor;
a third transistor comprising a source terminal and a drain terminal, the source terminal coupled to a ground, and the drain terminal coupled to the source terminal of the first transistor; and
a fourth transistor comprising a source terminal and a drain terminal, the source terminal coupled to the ground, and the drain terminal coupled to the drain terminal of the second transistor.

30. The apparatus of claim 29, wherein:
the first transistor comprises an n-type metal-oxide-semiconductor field-effect transistor (n-MOSFET);
the second transistor comprises a p-type metal-oxide-semiconductor field-effect transistor (p-MOSFET);

the fourth transistor comprises a gate terminal coupled to the drain terminal of the fourth transistor; and the third transistor comprises a gate terminal coupled to the gate terminal of the fourth transistor.

\* \* \* \* \*